United States Patent
Sekine

(10) Patent No.: US 8,890,991 B2
(45) Date of Patent: Nov. 18, 2014

(54) SOLID-STATE IMAGE PICKUP DEVICE AND SYSTEM HAVING PHOTODIODES OF VARYING SIZES AND SENSITIVITIES IN EACH UNITY CELL TO DETECT MOVEMENT OF A SUBJECT

(75) Inventor: Hirokazu Sekine, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 13/421,195

(22) Filed: Mar. 15, 2012

(65) Prior Publication Data

US 2013/0076953 A1  Mar. 28, 2013

(30) Foreign Application Priority Data

Sep. 22, 2011 (JP) ................................. 2011-207448

(51) Int. Cl.

| | |
|---|---|
| *H04N 5/14* | (2006.01) |
| *H04N 5/335* | (2011.01) |
| *G06F 3/042* | (2006.01) |
| *H04N 5/343* | (2011.01) |
| *G06F 3/03* | (2006.01) |
| *H04N 9/04* | (2006.01) |
| *H04N 5/355* | (2011.01) |
| *G06F 3/0488* | (2013.01) |

(52) U.S. Cl.
CPC ............... *G06F 3/042* (2013.01); *H04N 5/343* (2013.01); *G06F 3/0304* (2013.01); *H04N 9/045* (2013.01); *H04N 5/35563* (2013.01); *G06F 3/04883* (2013.01)
USPC .......................................... 348/308; 348/302

(58) Field of Classification Search
USPC ................. 348/302, 308; 250/208.1
See application file for complete search history.

(56) References Cited

U.S. PATENT DOCUMENTS 7,489,352 B2 * 2/2009 Nakamura ..................... 348/296
7,847,231 B2 * 12/2010 Hirose ........................ 250/208.1

(Continued)

FOREIGN PATENT DOCUMENTS

| JP | 09-200617 | 7/1997 |
|---|---|---|
| JP | 2001-083407 | 3/2001 |

(Continued)

OTHER PUBLICATIONS

Office Action issued Jan. 21, 2014, in Japanese Patent Application No. 2011-207448, filed Sep. 22, 2011 (with English-language Translation).

Korean Office Action issued Feb. 27, 2014 in Patent Application No. 10-2012-0026781 with English Translation.

*Primary Examiner* — Tuan Ho
*Assistant Examiner* — Shahbaz Nazrul
(74) *Attorney, Agent, or Firm* — Oblon, Spivak, McClelland, Maier & Neustadt, L.L.P.

(57) ABSTRACT

Certain embodiments provide a solid-state image pickup device including a first pixel, a second pixel, and an output circuit. The first pixel has a first photodiode and a first microlens that is formed above the first photodiode. The second pixel has a second photodiode and a second microlens which is formed above the second photodiode and is smaller than the first microlens. Further, the second pixel has a sensitivity of 1/n times of the first pixel and has a photoelectric conversion period of n times of the first pixel. The output circuit outputs a differential signal of a difference between a first detection signal based on a charge amount of the first signal charge and a second detection signal based on a charge amount of the second signal charge.

19 Claims, 12 Drawing Sheets

(56) References Cited

U.S. PATENT DOCUMENTS

| | | | |
|---|---|---|---|
| 2008/0018764 A1* | 1/2008 | Mizoguchi | 348/308 |
| 2008/0030605 A1* | 2/2008 | Tsukimura et al. | 348/302 |
| 2010/0066877 A1* | 3/2010 | Yamaguchi et al. | 348/279 |
| 2010/0134648 A1* | 6/2010 | Funatsu et al. | 348/222.1 |
| 2010/0277607 A1* | 11/2010 | Choi et al. | 348/222.1 |
| 2011/0140182 A1* | 6/2011 | Tanaka | 257/292 |
| 2011/0215223 A1* | 9/2011 | Unagami et al. | 250/208.1 |

FOREIGN PATENT DOCUMENTS

| | | |
|---|---|---|
| JP | 2005-286565 A | 10/2005 |
| JP | 2006-080937 | 3/2006 |
| JP | 2007-288522 | 11/2007 |
| JP | 2008-099073 | 4/2008 |
| JP | 2011-15219 | 1/2011 |

* cited by examiner

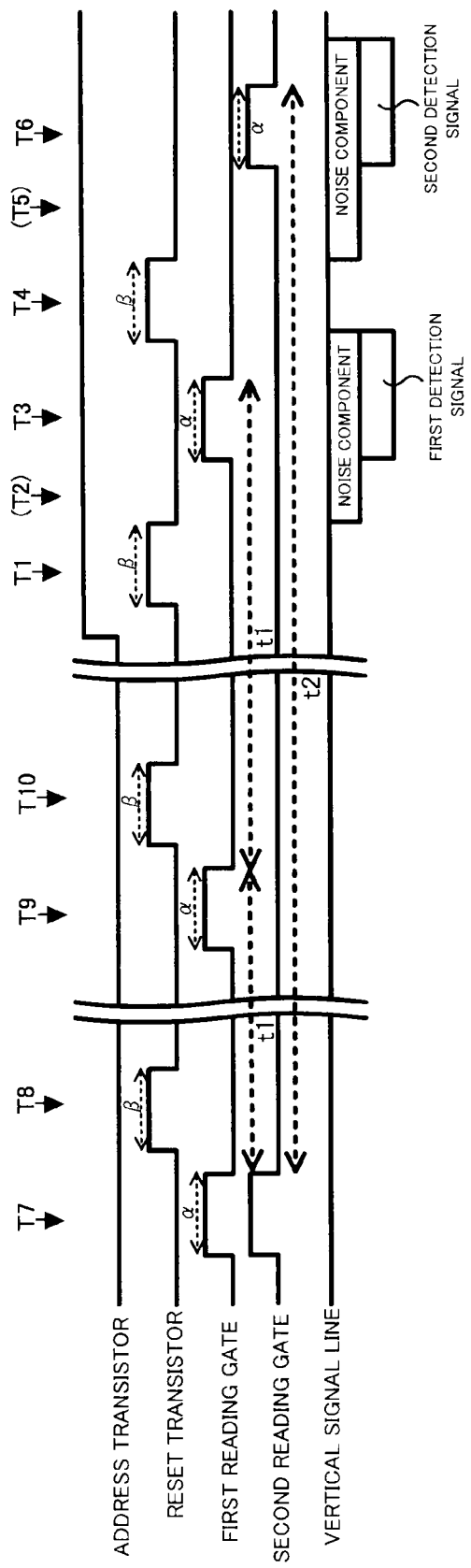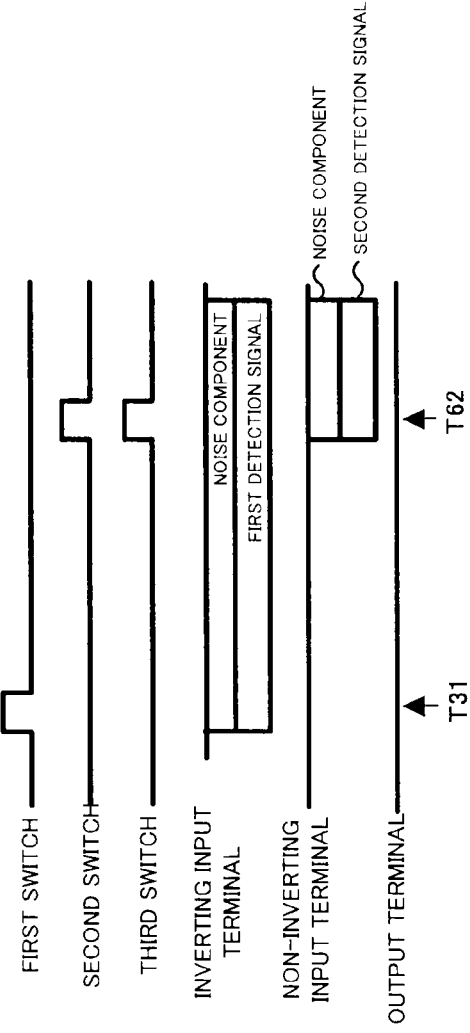

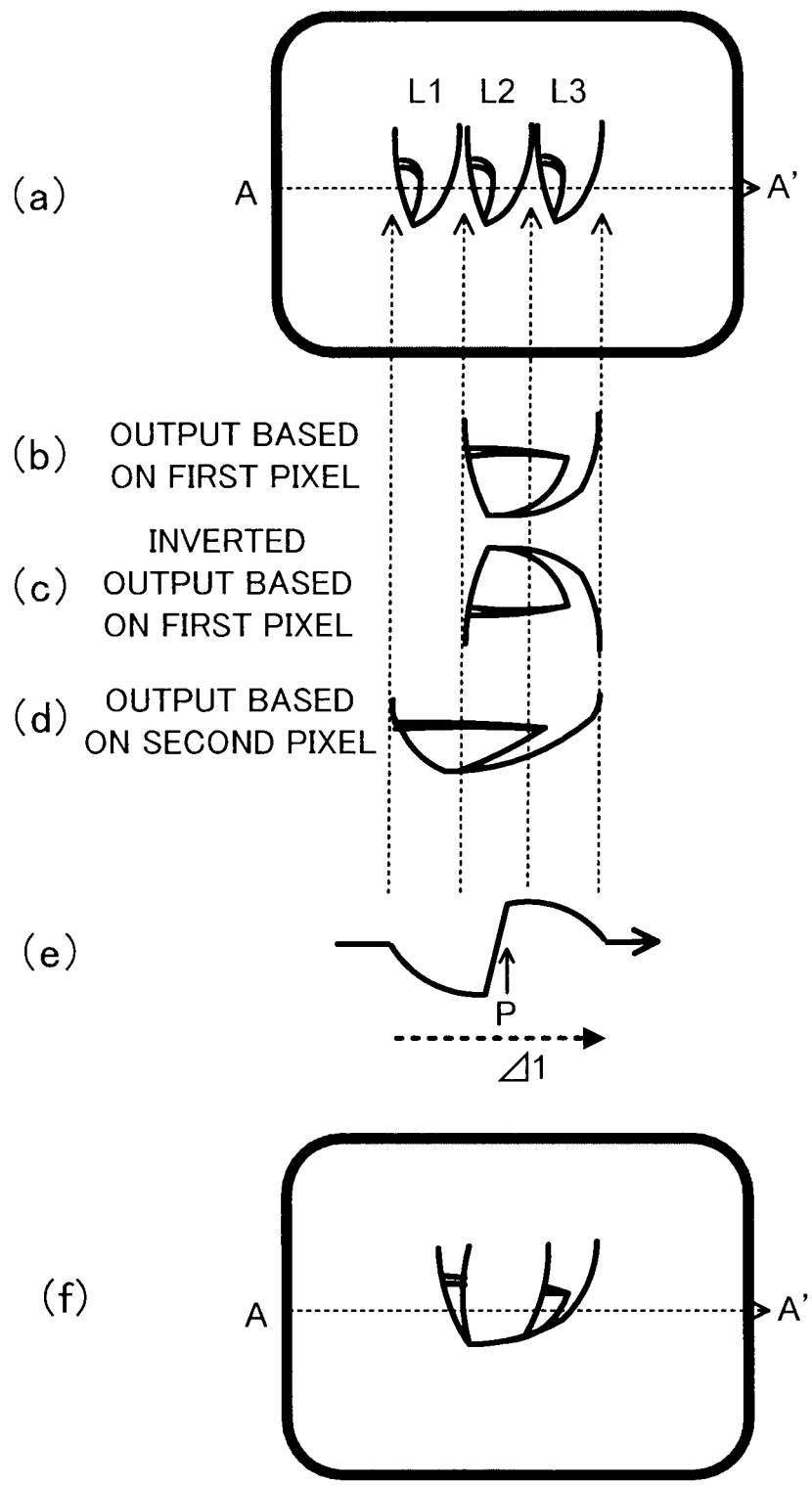

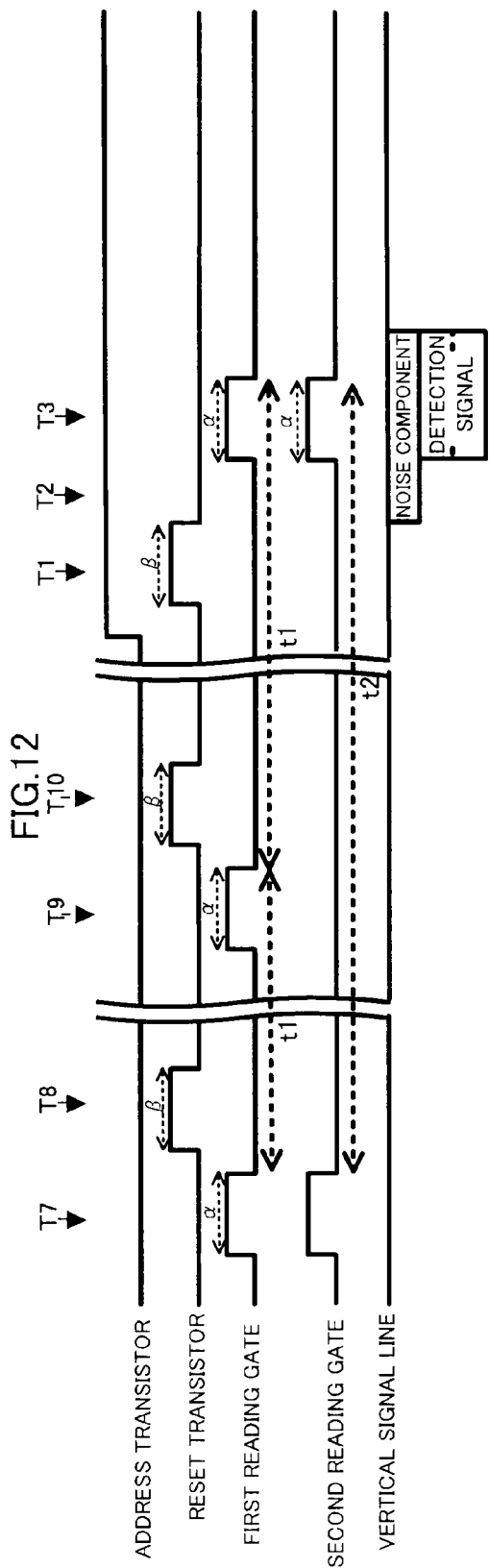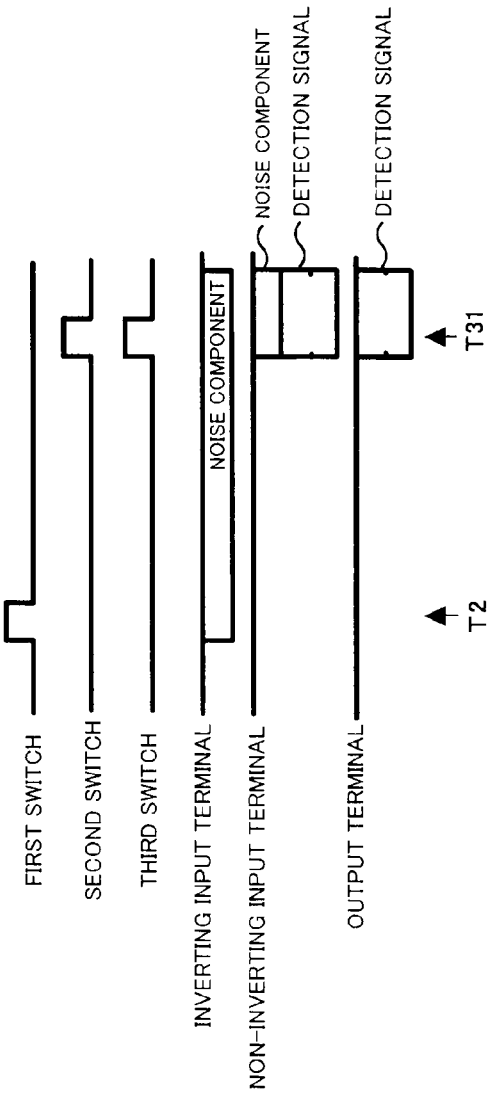

SOLID-STATE IMAGE PICKUP DEVICE AND SYSTEM HAVING PHOTODIODES OF VARYING SIZES AND SENSITIVITIES IN EACH UNITY CELL TO DETECT MOVEMENT OF A SUBJECT

CROSS REFERENCE TO RELATED APPLICATIONS

This application is based upon and claims the benefit of priority from the prior Japanese Patent Application No. 2011-207448 filed in Japan on Sep. 22, 2011; the entire contents of which are incorporated herein by reference.

FIELD

Embodiments described herein relate generally to a solid-state image pickup device and a solid-state image pickup system.

BACKGROUND

In recent years, development of an optical-system untouched panel is being progressed, as an input unit of a personal computer and a portable terminal. The untouched panel makes it possible to input characters and draw a picture without touching a display with a fingertip. According to an optical-system touched panel, it is possible to suppress staining of a display surface, because a fingertip is not contacted to a display. Further, according to the optical-system untouched panel, a transparent electrode that detects touch of a fingertip to a display becomes unnecessary, because characters are input and a picture is drawn by detecting movement of a fingertip. Therefore, it is possible to suppress reduction of brightness of a display due to light absorption by the transparent electrode.

Further, in a game field, as a unit that transmits will of a person to a machine, there is distributed a system that changes movement of a man appearing on a screen or that changes movement of a man into a reaction to a ball, by causing the movement of the man to be optically recognized.

For a camera that is applied to the untouched panel and the system, a CMOS sensor or a CCD sensor is used as a solid-state image pickup device. For example, the CMOS sensor has plural pixels arrayed in a lattice shape, the pixel having equal sizes and also having the same sensitivity. In a case of detecting movement of a subject such as a fingertip by using a camera to which a CMOS sensor like this is applied, for example, it is necessary to perform the following signal process by using a movement-detection signal processing circuit.

That is, images of a predetermined region that includes a subject which moves in each predetermined time interval are picked up, and the picked up images are compared by using the movement-detection signal processing circuit. By comparing the images with each other, a direction to which the subject moved and a distance in which the subject moved are detected. Accordingly, the movement of the subject can be detected.

However, because this signal process is a process that is based on a comparison between the images, there is a problem in that the process is very complex and a processing time is also long.

BRIEF DESCRIPTION OF THE DRAWINGS

FIG. 5 is a timing chart showing a relationship between operations of an address transistor, a reset transistor, a first reading gate, and a second reading gate, and detection signals that appear in a vertical signal line, in a movement detection mode;

FIG. 6 is a timing chart showing a relationship between operations of first to third switches, and a detection signals that are input to a differential amplifier and a differential signal that is output from the differential amplifier, in the movement detection mode;

FIGS. 7A-7F are explanatory diagrams for explaining the movement detection mode, and FIG. 7A shows a fingertip that is moving of which an image is to be picked up, FIG. 7B shows an output image when an image of a fingertip is picked up based on only a first pixel, FIG. 7C shows an inverted image of FIG. 7B, FIG. 7D shows an output image when an image of a fingertip is picked up based on only a second pixel, FIG. 7E shows a potential level of a detection signal that is output from each cell on a line along a dashed line A-A' in FIG. 7A, and FIG. 7F shows an output image by the solid-state image pickup device according to the present embodiment;

FIG. 12 is a timing chart showing a relationship between operations of an address transistor, a reset transistor, a first reading gate, and a second reading gate, and detection signals that appear in a vertical signal line, in a wide dynamic range mode;

FIG. 13 is a timing chart showing a relationship between operations of first to third switches, and detection signals that are input to a differential amplifier and a differential signal that is output from the differential amplifier, in the wide dynamic range mode;

DETAILED DESCRIPTION

Figure 1:
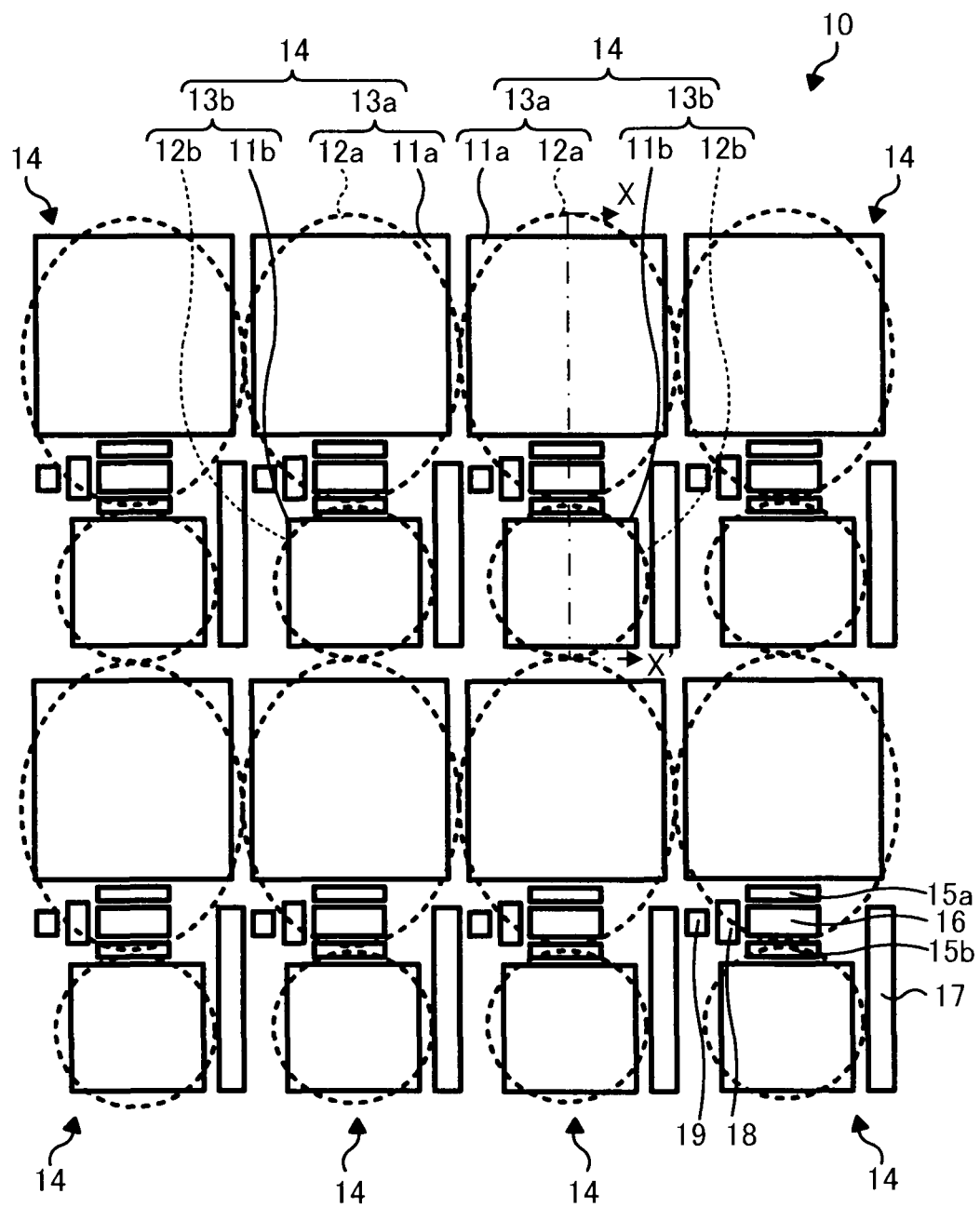
FIG. 1 is a plan view showing relevant parts of a solid-state image pickup device according to a first embodiment.

Certain embodiments provide a solid-state image pickup device including a first pixel, a second pixel, and an output circuit. The first pixel has a first photodiode that causes a first signal charge to be generated by receiving light and by photoelectrically converting the light, and a first microlens that is formed above the first photodiode. The second pixel has a second photodiode that causes a second signal charge to be generated by receiving light and by photoelectrically converting the light, and a second microlens that is formed above the second photodiode and that is smaller than the first microlens. Further, the second pixel has a sensitivity of 1/n times of the first pixel, and a photoelectric conversion period of n times of the first pixel. The output circuit outputs a differential signal of a difference between a first detection signal based on a charge amount of the first signal charge and a second detection signal based on a charge amount of the second signal charge.

Certain embodiments provide a solid-state image pickup system including a solid-state image pickup device including a first pixel, a second pixel, an output circuit, and an image forming unit. The first pixel has a first photodiode that causes a first signal charge to be generated by receiving light and by photoelectrically converting the light, and a first microlens that is formed above the first photodiode. The second pixel has a second photodiode that causes a second signal charge to be generated by receiving light and by photoelectrically converting the light, and a second microlens that is formed above the second photodiode and that is smaller than the first microlens. Further, the second pixel has a sensitivity of 1/n times of the first pixel, and a photoelectric conversion period of n times of the first pixel. The output circuit outputs a differential signal of a difference between a first detection signal based on a charge amount of the first signal charge and a second detection signal based on a charge amount of the second signal charge. The image forming unit forms an image based on the differential signal that is output from the output circuit. The solid-state image pickup system causes the output circuit to output zero as the differential signal, based on the first detection signal and the second detection signal becoming equal to each other, if the light is reflection light that is reflected by a stationary subject. The solid-state image pickup system detects movement of the subject, based on the first detection signal and the second detection signal becoming different from each other, by causing the output circuit to output a differential value between both detection signals as the differential signal, and by causing the image forming unit to form an image based on the differential value, if the light is reflection light that is reflected by a stationary subject.

Certain embodiments provide a solid-state image pickup device including a first pixel, a second pixel, an output circuit, and a control unit. The first pixel has a first photodiode that causes a first signal charge to be generated by receiving light and by photoelectrically converting the light, and a first microlens that is formed above the first photodiode. The second pixel has a second photodiode that causes a second signal charge to be generated by receiving light and by photoelectrically converting the light, and a second microlens that is formed above the second photodiode and that is smaller than the first microlens. Further, the second pixel has a sensitivity of 1/n times of the first pixel. The output circuit outputs a signal based on a charge amount of the first signal charge and a charge amount of the second signal charge. The control unit controls an operation of the output circuit, by supplying a mode switching signal to the output circuit. The output circuit outputs the signal based on a sum of or a difference between a charge amount of the first signal charge and a charge amount of the second signal charge.

Certain embodiments provide a solid-state image pickup system including a solid-state image pickup device including a first pixel, a second pixel, an output circuit, and an image forming unit. The first pixel has a first photodiode that causes a first signal charge to be generated by receiving light and by photoelectrically converting the light, and a first microlens that is formed above the first photodiode. The second pixel has a second photodiode that causes a second signal charge to be generated by receiving light and by photoelectrically converting the light, and a second microlens that is formed above the second photodiode and that is smaller than the first microlens, and further has a sensitivity of 1/n times of the first pixel. The output circuit outputs a signal based on a charge amount of the first signal charge and a charge amount of the second signal charge. The control unit controls an operation of the output circuit, by supplying a mode switching signal to the output circuit. The image forming unit forms an image based on the signal that is output from the output circuit, and outputs the image. The solid-state image pickup system causes the output circuit to output zero as the signal, based on the first detection signal based on a charge amount of the first signal charge and the second detection signal based on a charge amount of the second signal charge becoming equal to each other, if the output circuit receives the movement detection mode signal from the control unit as the mode switching signal and if the light is reflection light that is reflected by a stationary subject. The solid-state image pickup system detects movement of the subject, based on the first detection signal and the second detection signal becoming different from each other, by causing the output circuit to output a differential value between both detection signals as the signal, and by causing the image forming unit to form an image based on the differential value, if the output circuit receives the movement detection mode signal from the control unit as the mode switching signal and if the light is reflection light that is reflected by a moving subject. The solid-state image pickup system causes the output circuit to output the signal, based on a sum of a charge amount of the first signal charge and a charge amount of the second signal charge, and causes the image forming unit to form the image based on the signal based on the sum, if the output circuit receives the wide dynamic range mode signal from the control unit as the mode switching signal.

A solid-state image pickup device and a solid-state image pickup system according to the embodiments are explained in detail below with reference to the drawings.

A First Embodiment

FIG. 1 is a plan view showing relevant parts of a solid-state image pickup device 10 according to a first embodiment. The solid-state image pickup device 10 shown in FIG. 1 is the solid-state image pickup device 10 of a CMOS type that has plural pixels 13a, 13b arrayed in a lattice shape.

In the solid-state image pickup device 10, the pixels 13a, 13b that are adjacent to each other in a longitudinal direction have mutually different sensitivities. The solid-state image pickup device according to the present embodiment is what is called a two-pixel one-cell type solid-state image pickup device that has two pixels 13a, 13b of different sensitivities as a unit cell 14.

Each unit cell 14 has a first pixel 13a of a high sensitivity, and a second pixel 13b of a low sensitivity. The first pixel 13a of a high sensitivity has a first photodiode 11a of a quadrangular shape having a large area, and a first microlens 12a having a large size (a surface area or a height) that is formed above the first photodiode 11a. The second pixel 13b of a low sensitivity has a second photodiode 11b of a quadrangular shape having a smaller area than that of the first photodiode 11a, and a second microlens 12b having a smaller size than that of the first microlens 12a, formed above the second photodiode 11b.

A saturation level of each of the pixels 13a, 13b, that is, a maximum signal charge amount that can be accumulated by a photoelectric conversion performed by each of the photodiodes 11a, 11b is determined by an area of each of the photodiodes 11a, 11b. Because the area of the first photodiode 11a is larger than that of the second photodiode 11b, a saturation level of the first pixel 13a is higher than a saturation level of the second pixel 13b.

The first pixel 13a has a higher sensitivity than that of the second pixel 13b, and a signal charge amount accumulated per unit time in the first photodiode 11a is larger than that of the second photodiode 11b. Therefore, it is preferable that the first photodiode 11a is larger than the second photodiode 11b, like a relationship in the solid-state image pickup device 10 according to the present embodiment. However, when both the first photodiode 11a and the second photodiode 11b have a certain size in which saturation is not generated, a relationship between the sizes of these photodiodes 11a, 11b is not limited to the above-described relationship. Therefore, the first photodiode 11a can be smaller than the second photodiode 11b, like a relationship in a solid-state image pickup device 60 shown in FIG. 15 described later, for example.

Sensitivities of the pixels 13a, 13b are determined by the sizes of the microlenses 12a, 12b. Because the first microlens 12a has a larger size than that of the second microlens 12b, a sensitivity of the first pixel 13a is higher than a sensitivity of the second pixel 13b.

The solid-state image pickup device 10 according to the present embodiment has plural unit cells 14, each having the first pixel 13a and the second pixel 13b, arrayed in a lattice shape. That is, the solid-state image pickup device 10 according to the present embodiment has plural unit cells 14 arrayed in a lattice shape, such that the first microlens 12a and the second microlens 12b in the same unit cell 14 are adjacent to each other in a longitudinal direction (hereinafter, "vertical direction") in the drawing, and that the first microlenses 12a in different unit cells 14 are adjacent to each other in a lateral direction (hereinafter, "horizontal direction") in the drawing. In this case, although the second microlenses 12b in different unit cells 14 are separated from each other in a horizontal direction, the second microlenses 12b are close to each other.

In each unit cell 14, there are provided a first reading gate 15a that reads a signal charge (hereinafter, "first signal charge") that is accumulated in the first pixel 13a, a second reading gate 15b that reads a signal charge (hereinafter, "second signal charge") that is accumulated in the second pixel 13b, a detecting unit 16 that detects the first and second signal charges, an output circuit 17 of a unit cell that outputs first and second detection signals based on the first and second signal charges that are detected, a reset transistor 18 that resets the detecting unit 16 such that the detecting unit 16 has a constant potential and that discharges a surplus charge, and a drain 19 as a discharge destination of the surplus charge.

The first reading gate 15a is provided at a position close to one side of the first photodiode 11a of the first pixel 13a. The second reading gate 15b is provided at a position close to one side of the second photodiode 11b of the second pixel 13b.

The detecting unit 16 is provided between the first reading gate 15a and the second reading gate 15b. The detecting unit 16 receives the first signal charge that is detected from the first pixel 13a by the first reading gate 15a, and the second signal charge that is detected from the second pixel 13b by the second reading gate 15b.

The output circuit 17 of a unit cell is a circuit that is provided at a position close to the second pixel 13b, and that outputs the first and second detection signals corresponding to charge amounts of the first and second signal charges.

The reset transistor 18 is provided at a position where the detecting unit 16 is sandwiched by the transistor 18 and the output circuit 17 of a unit cell. The reset transistor 18 keeps a potential of the detecting unit 16 at a constant level, by discharging the surplus charge accumulated in the detecting unit 16 from the detecting unit 16, and by transferring the discharged surplus charge to the drain 19 provided near the reset transistor 18.

Figure 2:
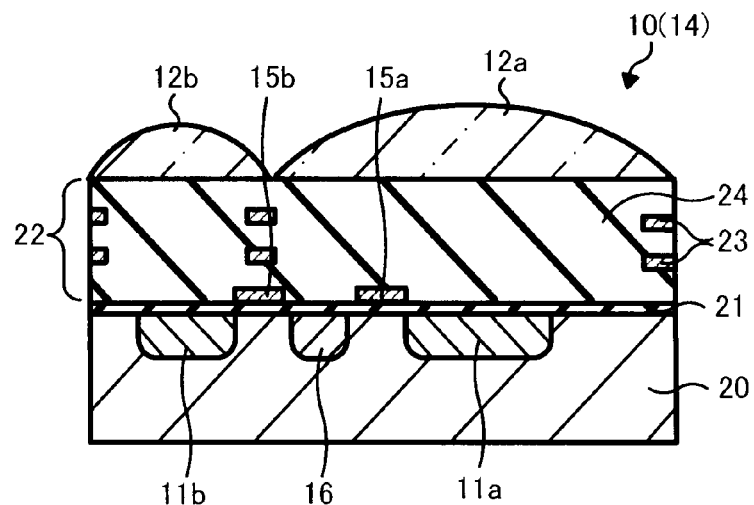
FIG. 2 is a partial cross-sectional view of the solid-state image pickup device along a dashed line X-X' in FIG. 1.

FIG. 2 is a partial cross-sectional view of the solid-state image pickup device 10 along a dashed line X-X' in FIG. 1. As shown in FIG. 2, in the unit cell 14 of the solid-state image pickup device 10, the first photodiode 11a and the second photodiode 11b as an N+ type impurity layer are formed at mutually separated positions, on a surface of a P-type semiconductor substrate 20 made of silicon, for example. Further, on a surface of the semiconductor substrate 20, the detecting unit 16 as an N+ type impurity layer is formed at a position sandwiched between the first photodiode 11a and the second photodiode 11b.

On the surface of the semiconductor substrate 20, the first gate electrode 15a as the first reading gate 15a is formed via an oxide film 21, between the first photodiode 11a and the detecting unit 16. Similarly, the second gate electrode 15b as the second reading gate 15b is formed via the oxide film 21, between the second photodiode 11b and the detecting unit 16.

On the surface of the semiconductor substrate 20, a wiring layer 22 is formed via the oxide film 21. The wiring layer 22 includes the first gate electrode 15a, the second gate electrode 15b, and a wiring 23, and these are insulated from each other by an insulator 24.

On a surface of the wiring layer 22, the first microlens 12a and the second microlens 12b are formed. The first microlens 12a is formed on the first photodiode 11a, and the second microlens 12b is formed on the second photodiode 11a.

In the solid-state image pickup device 10, when a desired voltage is applied to the first gate electrode 15a, for example, because a channel is formed on the surface of the semiconductor substrate 20 immediately below the first gate electrode 15a, the first signal charge that is accumulated in the first photodiode 11a can be transferred to the detecting unit 16 via the channel. Similarly, when a desired voltage is applied to the second gate electrode 15b, because a channel is formed on the surface of the semiconductor substrate 20 immediately below the second gate electrode 15b, the second signal charge that is accumulated in the second photodiode 11b can be transferred to the detecting unit 16 via the channel.

Transfer of a charge in the reset transistor 18 is also similarly performed.

Figure 3:
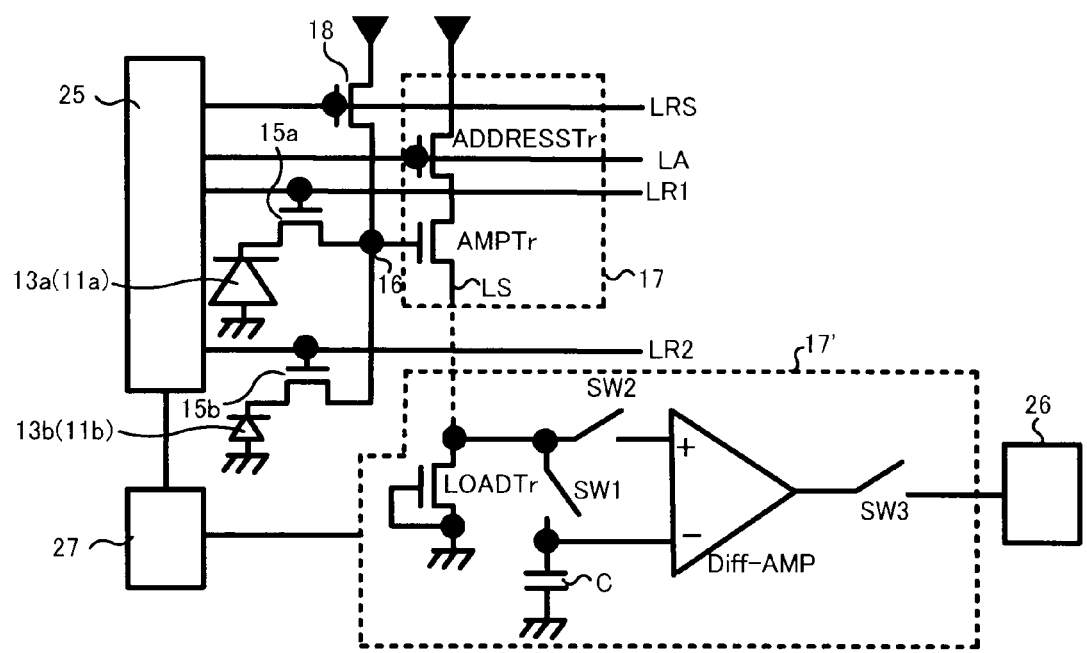
FIG. 3 is an equivalent circuit of the solid-state image pickup device, including a unit cell of the solid-state image pickup device in the first embodiment, and a common output circuit that is arranged in common with plural unit cells.

FIG. 3 is an equivalent circuit diagram of the solid-state image pickup device, including a unit cell 14 of the solid-state image pickup device 10 according to the present embodiment, and a common output circuit 17' that is arranged in common with plural unit cells 14. As shown in FIG. 3, the first reading gate 15a is connected to the first photodiode 11a that constitutes the first pixel 13a having a high sensitivity. Similarly, the second reading gate 15b is connected to the second photodiode 11b that constitutes the second pixel 13b having a low sensitivity.

Outputs of the first reading gate 15a and the second reading gate 15b are connected in common to the detecting unit 16. The detecting unit 16 is connected to the reset transistor 18, in a vertical direction, and is connected to the output circuit 17 of a unit cell, in a horizontal direction.

The output circuit 17 of a unit cell includes an amplifier transistor AMPTr for converting the first and second signal charges that are received by the detecting unit 16 into a voltage signal, and an address transistor ADDRESSTr for selecting the unit cell 14. The detecting unit 16 is connected to a control gate of the amplifier transistor AMPTr of the output circuit 17 of a unit cell, in a horizontal direction.

A drain of the amplifier transistor AMPTr is connected to the address transistor ADDRESSTr, and a source of the amplifier transistor AMPTr is connected to a load transistor LOADTr via a vertical signal line LS.

The common output circuit 17' that includes first to third switches SW1, SW2, SW3, a differential amplifier Diff-AMP, and the load transistor LOADTr is used in common with plural unit cells 14 that are arrayed in a vertical direction.

A control gate of the first reading gate 15a is connected to a vertical register 25 as a peripheral circuit via a first lead LR1, and a control gate of the second reading gate 15b is connected to the vertical register 25 via a second lead LR2. A gate electrode of the reset transistor 18 is connected to the vertical resistor 25 via a reset line LRS, and a gate electrode of the address transistor ADDRESSTr is connected to the vertical register 25 via an address line LA.

An output of the amplifier transistor AMPTr is connected to an inverting input terminal (hereinafter, "minus terminal") of the differential amplifier Diff-AMP via the load transistor LOADTr and the first switch SW1, and at the same time, is connected to a non-inverting input terminal (hereinafter, "plus terminal") of the differential amplifier Diff-AMP via the load transistor LOADTr and the second switch SW2. An output of the first switch SW1 is connected to the minus terminal of the differential amplifier Diff-AMP, and at the same time, is connected to the other end of a capacitor C of which one end is grounded.

The third switch SW3 is connected to an output of the differential amplifier Diff-AMP. An image forming unit 26 that forms an image based on a signal that is output from the third switch SW3 is connected to the third switch SW3.

The common output circuit 17' is set at a lower part of each vertical signal line LS. The third switch SW3 is connected to a horizontal register (not shown), and a differential output of one horizontal scanning line is caused to be sequentially output to an outside via a horizontal output line (not shown), by sequentially turning on the SW 3. The image forming unit 26 includes a horizontal register and a horizontal output line.

A control unit 27 that controls the vertical register 25 and the common output circuit 17' is connected to the vertical register 25 and the common output circuit 17'. The control unit 27 controls operations of the vertical register 25 and the common output circuit 17', by outputting a control signal to the vertical register 25 and the common output circuit 17'.

That is, based on the control signal that the control unit 27 outputs to the vertical register 25, the vertical register 25 outputs a signal to the first reading gate 15a, the second reading gate 15b, the reset transistor 18, and the address transistor ADDRESSTr, for operating the first reading gate 15a, the second reading gate 15b, the reset transistor 18, and the address transistor ADDRESSTr at a desired timing.

Based on the control signal that the control unit 27 outputs at a desired timing to each of the first to third switches SW1, SW2, SW3, and the load transistor LOADTr that are included in the common output circuit 17', the first to third switches SW1, SW2, SW3, and the load transistor LOADTr operate at a desired timing.

When a circuit that includes the first reading gate 15a, the second reading gate 15b, the reset transistor 18, and the output circuit 17 of the unit cell 14 that are provided in each unit cell 14, the vertical register 25, and the common output circuit 17' is called an output circuit, the output circuit performs a desired operation at a desired timing, based on the control signal that the control unit 27 outputs to the output circuit.

Figure 4:
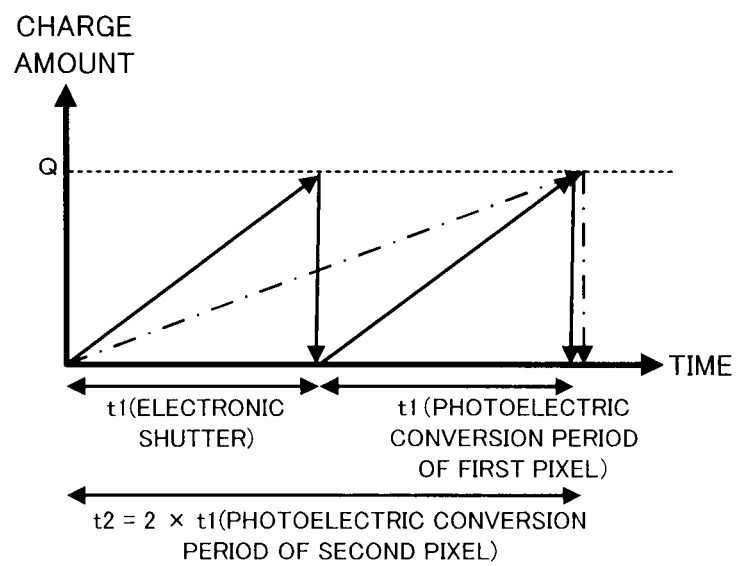
FIG. 4 is an explanatory view for showing a relationship between a photoelectric conversion period of a first pixel 13a and a second pixel 13b, and a charge amount of a first signal charge that is accumulated in the pixel 13a and a charge amount of a second signal charge that is accumulated in the pixel 13b.

An image pickup method used by the solid-state image pickup device 10 according to the present embodiment is explained next. This image pickup method is a method of realizing a movement detection mode. The movement detection mode is a mode for outputting an outline of a moving subject as an image, without outputting a subject in a stationary state as an image. A method of realizing the movement detection mode is explained with reference to FIG. 4. FIG. 4 is an explanatory view for showing a relationship between a photoelectric conversion period of the first pixel 13a and the second pixel 13b, and a charge amount of a first signal charge that is accumulated in the pixel 13a and a charge amount of a second signal charge that is accumulated in the pixel 13b. An arrowhead of a solid line in the drawing indicates a charge amount of the first signal charge that is accumulated in the first pixel 13a, and an arrowhead of a dashed line in the drawing indicates a charge amount of the second signal charge that is accumulated in the second pixel 13b. In the following explanation, a sensitivity ratio of a sensitivity of the first pixel 13a to a sensitivity of the second pixel 13b is assumed as 2:1.

As shown in FIG. 4, first, photoelectric conversion of the first pixel 13a and photoelectric conversion of the second pixel 13b are started simultaneously, the first pixel 13a and the second pixel 13b having mutually different sensitivities. Because the sensitivity of the first pixel 13a is two times of the sensitivity of the second pixel 13b, a charge amount of the first signal charge that is accumulated in the first pixel 13a by the photoelectric conversion increases at a rate of two times of the charge amount of the second signal charge that is accumulated in the second pixel 13b.

After a lapse of a predetermined time t1, only the first signal charge that is accumulated in the first pixel 13a is discharged. This discharge operation is what is called an electronic shutter, and the first signal charge that is accumulated in the first pixel 13a is discharged to the drain 19 via the reset transistor 18. The photoelectric conversion of the second pixel 13b is continuously performed.

After the electronic shutter of the first pixel 13a ends, the photoelectric conversion of the first pixel 13a is started again.

After a lapse of the predetermined time t1 since the end of the electronic shutter, that is, after a lapse of the photoelectric conversion period t1 of the first pixel 13a, the first signal charge that is accumulated in the first pixel 13a is read out.

Further, at a timing slightly deviated from a timing of reading the first signal charge that is accumulated in the first pixel 13a, that is, after a lapse of substantially a photoelectric conversion period t2 (=2×t1) of the second pixel 13b, the second signal charge that is accumulated in the second pixel 13b is read out.

In a case of picking up 30 images at each second, and when each image has 500 pixels in a vertical direction, a slight difference between a timing of reading the first signal charge from the first pixel 13a and a timing of reading the second signal charge from the second pixel 13b is about 64 μs, for example.

In the present embodiment, although the photoelectric conversion period of the second pixel 13b is set two times of the photoelectric conversion period of the first pixel 13a, in general, when a sensitivity of the first pixel 13a is n times of a sensitivity of the second pixel 13b, both photoelectric conversion periods can be arbitrarily set by causing electronic shutters of both pixels to operate such that the photoelectric conversion period of the second pixel 13b becomes n times of the photoelectric conversion period of the first pixel 13a.

When the solid-stage image pickup device according to the present embodiment picks up images of a subject in a stationary state, a charge amount Q of the first signal charge that is read from the first pixel 13a and a charge amount Q of the second signal charge that is read from the second pixel 13b become substantially equal as shown in FIG. 4. However, when the solid-stage image pickup device picks up images of a moving subject, a charge amount of the first signal charge that is read from the first pixel 13a and a charge amount of the second signal charge that is read from the second pixel 13b become not equal, and a difference arises between both charge amounts.

Next, a subtraction process is performed by using the differential amplifier Diff-AMP, to the first detection signal based on a charge amount of the first signal charge that is read from the first pixel 13a, and the second detection signal based on a charge amount of the second signal charge that is read from the second pixel 13b.

As described above, when images of a subject in the stationary state are picked up, a charge amount of the first signal charge and a charge amount of the second signal charge are equal. Therefore, a voltage of the first detection signal and a voltage of the second detection signal become equal. Accordingly, when a subtraction process is performed to the first detection signal and the second detection signal, the differential amplifier Diff-AMP outputs zero as a differential signal.

However, when images of a moving subject are picked up, there arises a difference between a charge amount of the first signal charge and a charge amount of the second signal charge according to the movement of the subject. Accordingly, a difference also arises between a voltage of the first detection signal and a voltage of the second detection signal. Therefore, when a subtraction process is performed to the first detection signal and the second detection signal, the differential amplifier Diff-AMP outputs a differential signal as a difference between a voltage of the first detection signal and a voltage of the second detection signal. By imaging the differential signal, the solid-state image pickup device outputs an image corresponding to movement of the subject.

As explained above, the movement detection mode is realized by performing a subtraction process to the first and second detection signals that are obtained by picking up images of a subject by using the first and second pixels 13a, 13b, after setting a sensitivity ratio of the first pixel 13a to the second pixel 13b to 2:1, and also after setting a photoelectric conversion period ratio of the first pixel 13a to the second pixel 13b to 1:2.

In general, the movement detection mode is realized by performing a subtraction process to the first and second detection signals that are obtained by picking up images of a subject by using the first and second pixels 13a, 13b, after setting a sensitivity ratio of the first pixel 13a to the second pixel 13b to n:1, and also after setting the photoelectric conversion period ratio of the first pixel 13a to the second pixel 13b to 1:n.

The method of realizing the movement detection mode is explained in further detail with reference to FIG. 5 and FIG. 6 by referring to an equivalent circuit diagram of FIG. 3. FIG. 5 is a timing chart showing a relationship between operations of the address transistor ADDRESSTr, the reset transistor 18, the first reading gate 15a, and the second reading gate 15b, and first and second detection signals that appear in the vertical signal line LS, in the movement detection mode. FIG. 6 is a timing chart showing a relationship between operations of the first to third switches SW1, SW2, SW3, and first and second detection signals that are input to the differential amplifier Diff-AMP and a differential signal that is output from an output terminal of the differential amplifier Diff-AMP, in the movement detection mode.

The operation in the movement detection mode shown in FIG. 5 and FIG. 6 is performed by the control unit 27 (FIG. 3) that outputs a movement detection mode signal, as a mode switching signal as the control signal, to at least a part (the vertical register 25 and the common output circuit 17') of the output circuit described above.

When the address transistor ADDRESSTr (FIG. 3) is off, the first reading gate 15a and the second reading gate 15b are simultaneously turned on during a constant time α, at a timing of T7, as shown in FIG. 5. By turning on the gates 15a, 15b, the first and second signal charges that are accumulated in the first pixel 13a and the second pixel 13b are discharged to the detecting unit 16. Because the electronic shutter is performed to the first pixel 13a later at a timing of T9, the first reading gate 15a is not necessarily required to be turned on at the timing of T7.

Next, the reset transistor 18 is kept on during only a constant time β at a timing of T8. By keeping the transistor 18 on, the first and second signal charges that are accumulated in the detecting unit 16 are transmitted to the drain 19 as a surplus charge, and a potential of the detecting unit 16 is kept at a constant level. Because the reset transistor 18 is turned on later at the timing of T1, the reset transistor 18 is not necessarily required to be turned on at this timing.

Next, the first reading gate 15a is turned on again at a timing of T9 and is kept on by the constant time α, after a lapse of a time t1−α since the first reading gate 15a is turned off. That is, what is called an electronic shutter is performed in the first pixel 13a. By turning on the first reading gate 15a, the first signal charge that is accumulated in the first pixel 13a is discharged to the detecting unit 16 again. At this time, the second reading gate 15b is not turned on, and photoelectric conversion is continued to the second pixel 13b.

Next, the reset transistor 18 is turned on again at a timing of T10 and is kept on by the constant time β. By keeping the transistor 18 on, the first signal charge that is accumulated in the detecting unit 16 is transmitted to the drain 19 as a surplus charge, and a potential of the detecting unit 16 is kept at a constant level. Because the reset transistor 18 is turned on later at the timing of T1, the reset transistor 18 is not necessarily required to be turned on at this timing.

Next, the address transistor ADDRESSTr is turned on, and the reset transistor 18 is turned on at the timing of T1, and is kept on during the constant time β. When the reset transistor 18 is turned on, the first signal charge or the second signal charge that is so far accumulated in the detecting unit 16 is discharged to the drain 19, and a potential of the detecting unit 16 is maintained at a constant level. Thereafter, when the reset transistor 18 is turned off, the detecting unit 16 detects noise by induction, and this noise is added to a control gate of the amplifier transistor AMPTr. Therefore, a noise component is generated in the vertical signal line LS.

Next, after a lapse of a time t1–α since the electronic shutter of the first pixel 13a ends, the first reading gate 15a is turned on again at a timing of T3, and is kept on during the constant period α. By turning on the gate 15a, the first signal charge that is accumulated in the first pixel 13a is read out. The first signal charge is detected by the detecting unit 16, and is applied to the control gate of the amplifier transistor AMPTr. Therefore, the first detection signal based on a charge amount of the first signal charge is generated in the vertical signal line LS. The first detection signal is superimposed with the noise component.

A period from when the first reading gate 15a is turned off at the timing of T9 to when the first reading gate 15a is turned off at the timing of T3 is the photoelectric conversion period t1 of the first pixel 13a.

Next, the reset transistor 18 is turned on at a timing of T4, and is kept on during the constant period β. When the reset transistor 18 is turned on, a potential of the detecting unit 16 is kept at a constant level. Thereafter, when the reset transistor 18 is turned off, noise of the same level as that of noise that is generated when the reset transistor 18 is turned off at the timing of T1 is generated in the reset transistor 18, and a noise component is generated again in the vertical signal line LS.

Thereafter, after a lapse of a time t2-a since the second reading gate 15b is turned off at a timing of T7, the second reading gate 15b is turned on at a timing of T6, and is kept on during the constant period α. By turning on the gate 15b, the second signal charge that is accumulated in the second pixel 13b is read out. The second signal charge is detected by the detecting unit 16, and is applied to the control gate of the amplifier transistor AMPTr. Therefore, the second detection signal based on a charge amount of the second signal charge is generated in the vertical signal line LS. The second detection signal is superimposed with the noise component.

A period from when the second reading gate 15b is turned off at the timing of T7 to when the second reading gate 15b is turned off at the timing of T6 is the photoelectric conversion period t2 of the second pixel 13b. The photoelectric conversion period t2 is actually slightly longer than two times of the photoelectric conversion period t1 of the first pixel 13a. However, by setting a deviation between both timings of T3 and T6 small such that t2 becomes substantially equal to 2×t1, the photoelectric conversion period t2 of the second pixel 13b can be regarded as two times of the photoelectric conversion period t1 of the first pixel 13a.

While the photoelectric conversion period t2 of the second pixel 13b is regarded as two times of the photoelectric conversion period t1 of the first pixel 13a, a sensitivity of the second pixel 13b is ½ times of the first sensitivity 13a. Therefore, when images of a subject in the stationary state are picked up, a charge amount of the first signal charge that is read from the first pixel 13a and a charge amount of the second signal charge that is read from the second pixel 13b become substantially the same. However, when images of a moving subject are picked up, a difference arises between the charge amount of the first signal charge and the charge amount of the second signal charge.

When the first signal charge is read at a timing of T3 as shown in FIG. 5, thereafter, as shown in FIG. 6, the first switch SW1 is turned on at a timing of T31, and is kept on during a constant time. Then, the first detection signal based on a charge amount of the first signal charge is input to an inverting input terminal (hereinafter, "minus terminal") of the differential amplifier Diff-AMP, together with a noise component. At the same time, the first detection signal and the noise component are input to the capacitor C. Therefore, a potential held by the first detection signal and the noise component is charged to the capacitor C. Accordingly, during a constant period, the capacitor C holds the potential held by the first detection signal and the noise component. Consequently, even when the first switch SW1 is turned off, the potential that is charged to the capacitor C is continued to be applied to the minus terminal of the differential amplifier Diff-AMP during a constant period.

Further, as shown in FIG. 5, when the second signal charge is read from the second pixel 13b at the timing of T6, thereafter, the second and third switches SW2, SW3 are turned on at a timing of T62, and are kept on during a constant period, as shown in FIG. 6. Then, the second detection signal based on a charge amount of the second signal charge is input to a non-inverting input terminal (hereinafter, "plus terminal") of the differential amplifier Diff-AMP, together with a noise component.

During a period when a potential held by the second detection signal and the noise component is being applied to the plus terminal of the differential amplifier Diff-AMP, a potential held by the first detection signal and the noise component is being applied to the minus terminal.

When a charge amount of the first signal charge that is read from the first pixel 13a and a charge amount of the second signal charge that is read from the second pixel 13b are the same, a potential of the first detection signal and a potential of the second detection signal are equal. Further, potentials of noise components that are superimposed with respective detection signals are also equal. Therefore, when the third switch SW3 is turned on at a timing of T62, and is kept on during a constant time, the differential amplifier Diff-AMP outputs zero as a differential signal. Because the noise component is also canceled, the differential amplifier Diff-AMP does not output the noise component either.

As explained above, when images of a subject in the stationary state are picked up, that is, when a charge amount of the first signal charge that is read from the first pixel 13a and a charge amount of the second signal charge that is read from the second pixel 13b are the same, the differential amplifier Diff-AMP outputs zero as a differential signal. Therefore, even when images of a subject in the stationary state are picked up, the solid-state image pickup device does not output an output image.

However, when a subject is moving, a difference arises between a charge amount of the first signal charge and a charge amount of the second signal charge, corresponding to the movement, and the differential amplifier Diff-AMP outputs a differential signal based on a difference between the first detection signal and the second detection signal. Therefore, when a subject is moving, the solid-stage image pickup device outputs an image based on the differential signal. The movement detection mode is realized as described above. Even when a subject is moving, because a noise component that is superimposed with the first detection signal and a noise component that is superimposed with the second detection signal are equal, both noise components are canceled by the differential amplifier Diff-AMP, and the noise components are not superimposed with a differential signal that is output from the differential amplifier Diff-AMP.

The movement detection mode by the solid-stage image pickup device according to the present embodiment is further explained with reference to FIG. 7A-7F. FIG. 7A-7F are explanatory diagrams for explaining in further detail the movement detection mode, and FIG. 7A shows a moving fingertip as an example of a subject, FIG. 7B shows an output image when an image of a fingertip is picked up based on only a first pixel, FIG. 7C shows an inverted image of FIG. 7B, FIG. 7D shows an output image when an image of a fingertip is picked up based on only a second pixel, FIG. 7E shows a potential level of an output signal that is output from each cell on a line along a dashed line A-A' in FIG. 7A, and FIG. 7F shows an output image by the solid-state image pickup device according to the present embodiment. In the following explanation, a sensitivity ratio of the first pixel to the second pixel is also assumed as 2:1.

As shown in FIG. 7A, consider a case where images of a fingertip that continuously moves in an order of L1, L2, L3 during a time Δ1 are picked up in the movement detection mode by the solid-state image pickup device according to the present embodiment.

It is assumed that an image pickup of the first pixel 13a of which a photoelectric conversion period is t1 is started at a timing when the fingertip is present at a position of L2 and an image pickup of the first pixel 13a ends at a timing when the fingertip is present at a position of L3. Further, it is assumed that an image pickup of the second pixel 13b of which a photoelectric conversion period is t2 is started at a timing when the fingertip is present at a position of L1 and an image pickup of the second pixel 13b ends at a timing when the fingertip is present at the position of L3.

In this case, as shown in FIG. 7B, when an image of a moving fingertip is picked up based on only the first pixel 13a, an image of the fingertip of a thickness corresponding to the photoelectric conversion period t1 is output as an output image. FIG. 7C shows an inverted output image of FIG. 7B.

As shown in FIG. 7D, when an image of a moving fingertip is picked up based on only the second pixel 13b, an image of the fingertip of a thickness corresponding to the photoelectric conversion period t2 is output as an output image.

The first detection signal that is obtained by picking up an image based on the first pixel 13a is input to the minus terminal of the differential amplifier Diff-AMP, and the first detection signal that is obtained by picking up an image based on the second pixel 13b is input to the plus terminal of the differential amplifier Diff-AMP. As a result, the differential amplifier Diff-AMP outputs a differential signal of a difference between both detection signals as an output signal. That is, the differential amplifier Diff-AMP outputs an image corresponding to a sum of the image shown in FIG. 7C as the inverted image of FIG. 7B and the image shown in FIG. 7D.

That is, when images of a fingertip that moves as shown in FIG. 7A are picked up, a potential level of a differential signal that is output from each cell at the position L1 falls to minus along a direction to which the fingertip moves, as shown in FIG. 7E. A potential level of a differential signal that is output from each cell at the position L2 increases along a direction to which the fingertip moves, becomes zero at a point P (a middle point of the positions L1 to L3), and further increases along a direction to which the fingertip moves. A potential level of an output signal that is output from each cell at the position L3 falls along a direction to which the fingertip moves.

When this is shown as an image, as shown in FIG. 7F, an image is not output from each cell near the position L2 where it appears that there is no movement, an image is output from each cell near the positions L1, L3 where it appears that there is movement, and only an outline of the moving fingertip is output. The movement detection mode is realized in this way.

The solid-state image pickup device according to the first embodiment explained above can detect movement of a subject by performing a subtraction process to the first and second detection signals that are obtained by picking up images of a subject by using the first and second pixels 13a, 13b, after setting a sensitivity ratio of the first pixel 13a to the second pixel 13b to n:1, and after setting a photoelectric conversion period ratio of the first pixel 13a to the second pixel 13b to 1:n. Therefore, movement of a subject can be easily detected, without performing a complex signal process of comparing between images.

(A Modification of the Movement Detection Mode)

In the movement detection mode, it can be arranged such that only a noise component is detected at timings of T2, T5, as shown in FIG. 5. That is, first, noise is detected at the above timings, and the differential amplifier Diff-AMP removes the noise that is superimposed with the first and second detection signals. Next, a difference is calculated between the first detection signal and the second detection signal from which noise is removed. With this arrangement, the movement detection mode can be realized.

When the first detection signal and the second detection signal from which noise is removed are separately taken out, images of a subject that are independent of the first pixel 13a and the second pixel 13b are picked up. In this case, a high-resolution mode is realized.

A Second Embodiment

Figure 8:
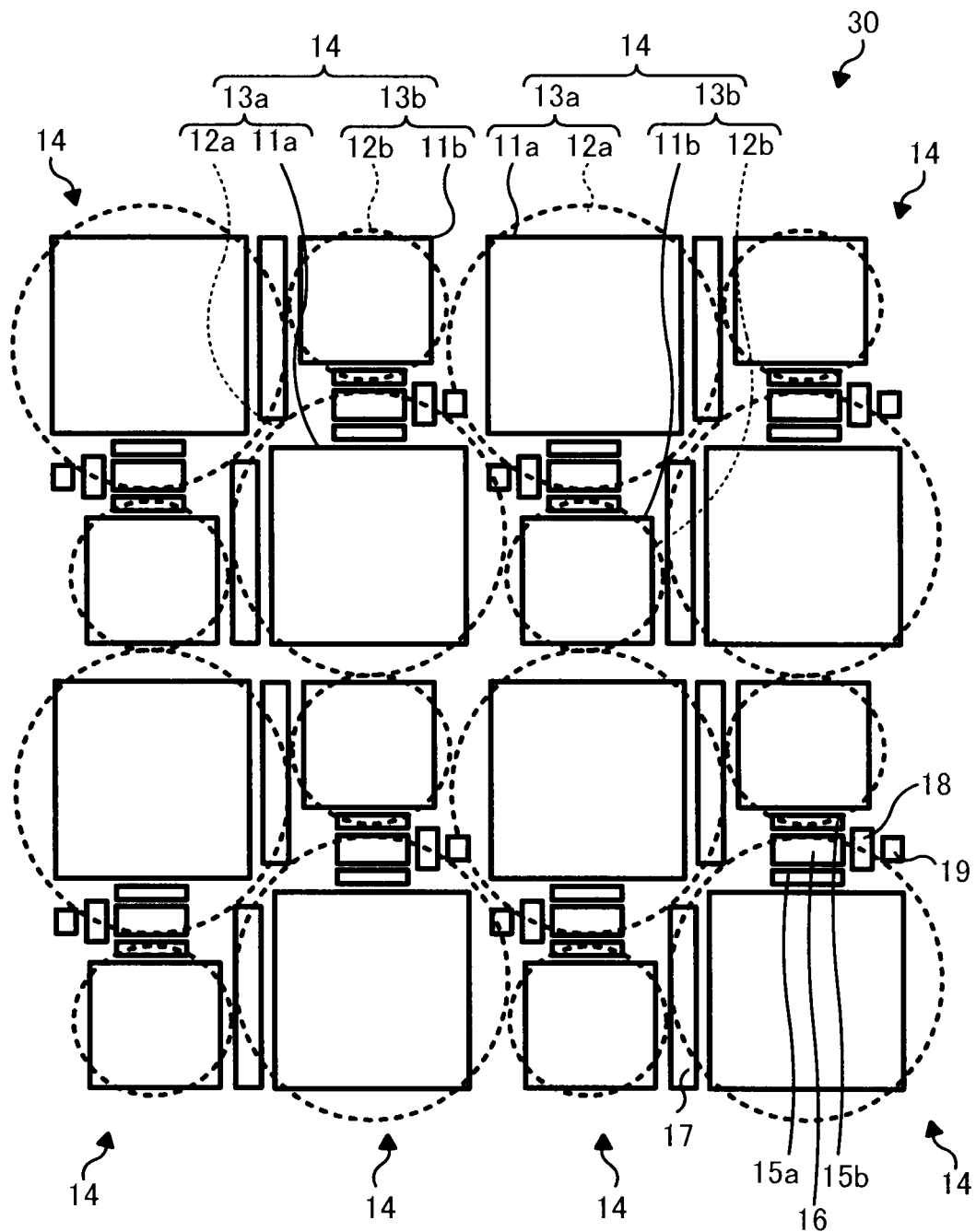
FIG. 8 is a plan view showing relevant parts of a solid-state image pickup device according to a second embodiment.

FIG. 8 is a plan view showing relevant parts of a solid-state image pickup device 30 according to a second embodiment. A second solid-state image pickup device 30 is different from a first solid-state image pickup device 10, in that an array of the unit cells 14 is different.

As shown in FIG. 8, the solid-state image pickup device 30 according to the second embodiment has plural unit cells 14 arrayed such that plural first microlenses 12a and plural second microlenses 12b are arrayed in a check shape.

That is, the solid-state image pickup device 30 according to the present embodiment has plural unit cells 14 arrayed such that the plural first microlenses 12a are arrayed in a check shape, and that the plural second microlenses 12b are arrayed in a check shape by arranging each second microlens 12b in a gap between the first microlenses 12a.

The solid-state image pickup device 30 can also realize the movement detection mode, by operating in a similar manner to that of the image pickup method by the solid-state image pickup device 10 according to the first embodiment.

The solid-state image pickup device 30 according to the second embodiment explained above also performs a subtraction process to the first and second detection signals that are obtained by picking up images of a subject by using the first and second pixels 13a, 13b, after setting a sensitivity ratio of the first pixel 13a to the second pixel 13b to n:1 and also after setting a photoelectric conversion period ratio of the first pixel 13a to the second pixel 13b to n:1. Therefore, the solid-state image pickup device 30 can also easily detect movement of a subject, for a reason similar to that of the solid-state image pickup device 10 according to the first embodiment.

Further, according to the solid-state image pickup device 30 according to the second embodiment, the solid-state image pickup device 30 can receive more light than that received by the solid-state image pickup device 10 according to the first embodiment, because gaps between the first and second microlenses 12a, 12b are reduced in the solid-state image pickup device 30. Therefore, the solid-state image pickup device 30 with improved sensitivities can be provided.

A Third Embodiment

Figure 9:
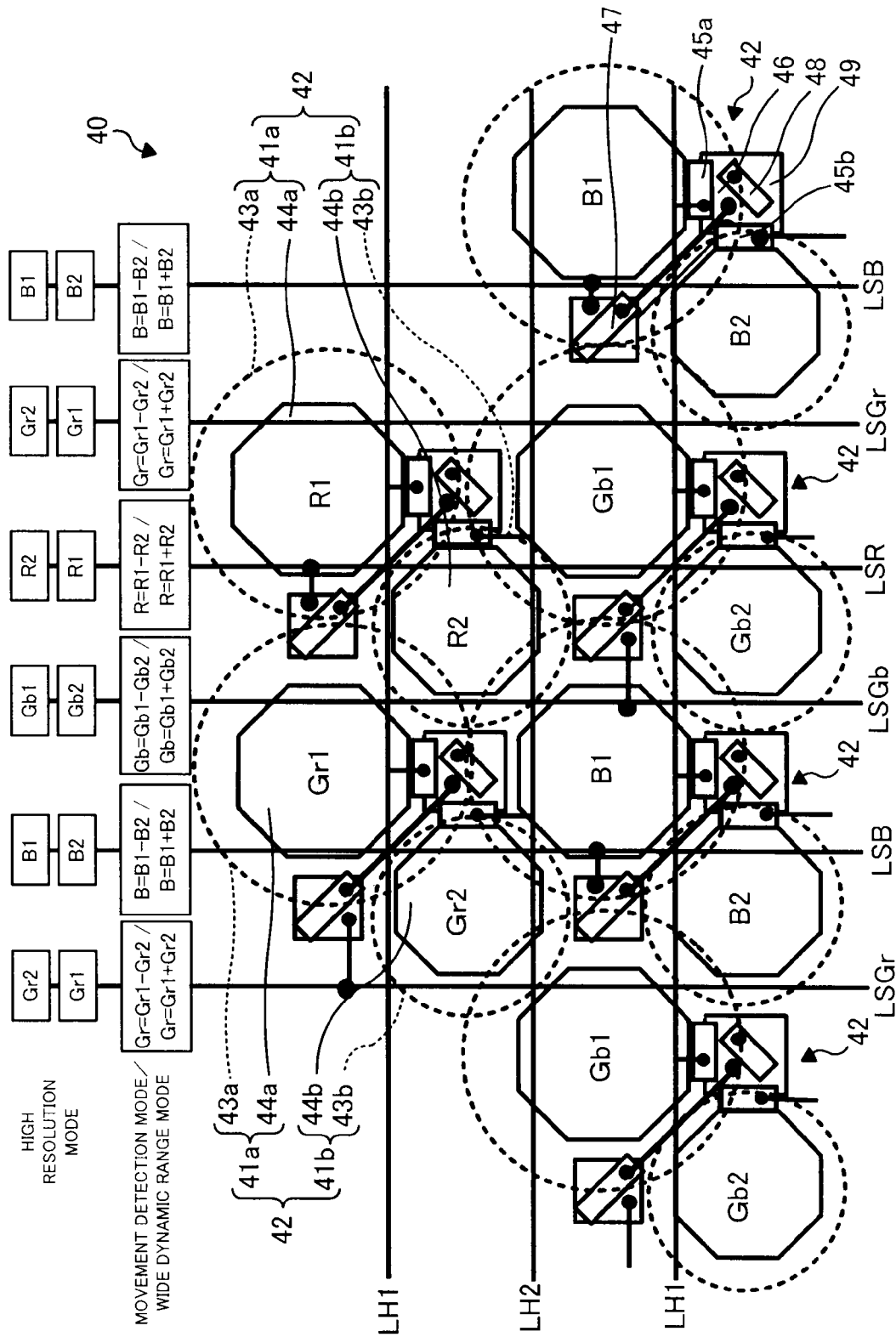
FIG. 9 is a plan view showing relevant parts of a solid-state image pickup device according to a third embodiment.

FIG. 9 is a plan view showing relevant parts of a solid-state image pickup device 40 according to a third embodiment. In a third solid-state image pickup device 40, sensitivities of pixels 41a, 41b that are adjacent to each other in an oblique direction are different from each other. The solid-state image pickup device 40 according to the present embodiment is what is called a two-pixel one-cell type solid-state image pickup device that has two pixels 41a, 41b having different sensitivities as a unit cell 42.

Further, the solid-state image pickup device 40 has color filters R1, R2, Gr1, Gr2, Gb1, Gb2, B1, B2 that cause light of any one of red, green, and blue to be transmitted to each unit cell, between the wiring layer 22 (FIG. 2) and first and second microlenses 43a, 43b. The red color filters R1, R2 that cause light of a red color to be transmitted, the green color filters Gr1, Gr2, Gb1, Gb2 that cause light of a green color to be transmitted, and blue color filters B1, B2 that cause light of a blue color to be transmitted are arrayed in a Bayer array corresponding to an array of unit cells 42.

Each unit cell 42 has a first pixel 41a of a high sensitivity, and a second pixel 41b of a low sensitivity. The first pixel 41a of a high sensitivity has a first photodiode 44a of a hexagonal shape having a large area, and a first microlens 43a having a large size that is formed above the first photodiode 44a. The second pixel 41b of a low sensitivity has a second photodiode 44b of a hexagonal shape having a smaller size than that of the first photodiode 44a, and a second microlens 43b having a smaller size than that of the first microlens 43a, formed above the second photodiode 44b.

The solid-state image pickup device 40 according to the present embodiment has plural unit cells 42 which are arrayed to face an oblique direction respectively in the drawing. The plural unit cells 42 are arrayed such that plural first microlenses 43a and plural second microlenses 43b are arrayed in a check shape.

That is, the solid-state image pickup device 40 according to the present embodiment has plural unit cells 42 arrayed such that the plural first microlenses 43a are arrayed in a check shape, and that the plural second microlenses 43b are arrayed in a check shape by arranging each second microlens 43b in a gap between the first microlenses 43a.

In each unit cell 42, there are provided first and second reading gates 45a, 45b, a detecting unit 46, an output circuit 47 of a unit cell, a reset transistor 48, and a drain 49.

The first reading gate 45a is provided at a position close to one side of the first photodiode 44a of the first pixel 41a. The second reading gate 45b is provided in perpendicular to the first reading gate 45a, at a position close to one side of the second photodiode 44b of the second pixel 41b.

The detecting unit 46 and the output circuit 47 of the unit cell are provided between the first pixel 41a and the second pixel 41b within the unit cell 42. The detecting unit 46 is provided between the first reading gate 45a and the second reading gate 45b, and the output circuit 47 of the unit cell is provided at a position opposite to the detecting unit 46.

The reset transistor 48 is provided at a position close to the detecting unit 46, and the drain 49 is provided at a position where this region 49 and the detecting unit 46 sandwich the reset transistor 48.

In the solid-state image pickup device 40 in which the unit cells 42 are arrayed, plural vertical signal lines LSGr, LSB, LSGb, LSR are connected in common to the output circuit 47 of respective unit cells of the plural unit cells 42 that have color filters of the same color in a vertical direction. Plural horizontal signal lines LH1 that are orthogonal with the vertical signal lines LSGr, LSB, LSGb, LSR are connected in common to respective first reading gates 45a of plural unit cells 42 that are adjacent in a horizontal direction. Between the plural horizontal signal lines LH1, plural horizontal signal lines LH2 that are arrayed in parallel with the horizontal signal lines LH1 are connected in common to respective second reading gates 45b of plural unit cells 42 that are adjacent in a horizontal direction.

The solid-state image pickup device 40 can also realize the movement detection mode, by operating in a similar manner to that of the image pickup method by the solid-state image pickup device 10 according to the first embodiment.

The solid-state image pickup device 40 according to the third embodiment explained above also performs a subtraction process to the first and second detection signals that are obtained by picking up images of a subject by using the first and second pixels 41a, 41b, after setting a sensitivity ratio of the first pixel 41a to the second pixel 41b to n:1 and also after setting a photoelectric conversion period ratio of the first pixel 41a to the second pixel 41b to 1:n. Therefore, the solid-state image pickup device 40 can also easily detect movement of a subject, for a reason similar reason to that of the solid-state image pickup device 10 according to the first embodiment.

Further, according to the solid-state image pickup device 40 according to the third embodiment, the first pixel 41a and the second pixel 41b within each unit cell 42 include color filters of the same color respectively. Further, when two filters of the same color within each unit cell 42 are regarded as one color filter, red color filters R, green color filters Gr, Gb, and blue color filters B that are each regarded as one color filter are arrayed in a Bayer array. Therefore, an image processing circuit that is usually used can be directly applied as an image processing circuit (not shown) that forms an image having a color from a differential signal that is output from the differential amplifier Diff-AMP.

A Fourth Embodiment

Figure 10:
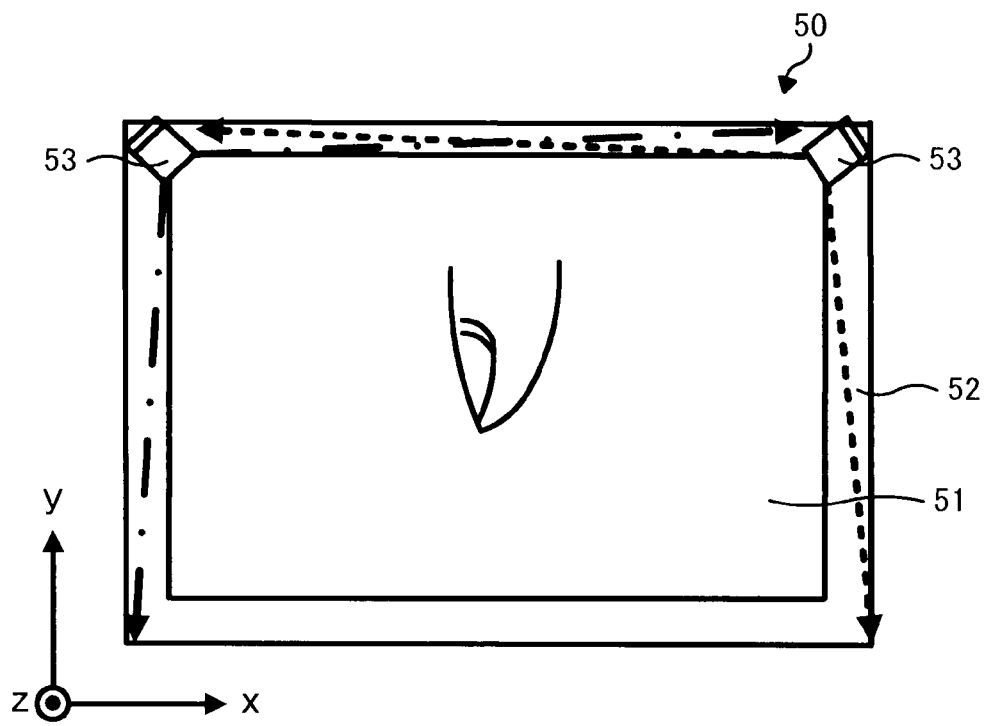
FIG. 10 is a plan view showing relevant parts of a solid-state image pickup device according to a fourth embodiment.
Figure 11:
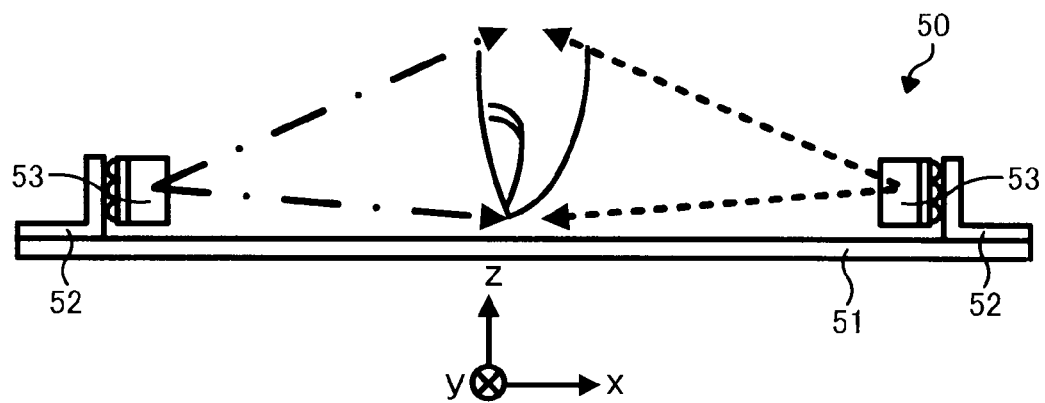
FIG. 11 is a side view showing relevant parts of a solid-state image pickup device according to the fourth embodiment.

FIG. 10 is a plan view schematically showing an untouched panel 50 as a solid-state image pickup system 50 that uses any one of the first to third solid-state image pickup devices 10, 30, 40. FIG. 11 is a schematic side view showing the untouched panel 50.

As shown in FIG. 10 and FIG. 11, a frame unit 52 is provided at a peripheral portion of a display 51, for example, as a display unit. The frame unit 52 is provided with plural cameras 53 to which the solid-state image pickup device 10 according to the first embodiment, for example, is applied. The cameras 53 area provided at a right upper corner and a left upper corner of the frame unit 52, for example.

The cameras 53 can be ones to which the solid-state image pickup devices 30, 40 according to the second or third embodiment are applied.

In the untouched panel 50 like this, each camera 53 is operated in the movement detection mode, and images of a fingertip shown in FIG. 10, for example, are picked up as a subject. In this case, each solid-state image pickup device 10 owned by each camera 53 outputs zero as a differential signal from the output circuit, when images of a stationary fingertip are picked up, and outputs a differential signal other than zero from the output circuit, when images of a moving finger are picked up. Further, when a differential signal other than zero is output, the image forming unit 26 (FIG. 3) forms an image based on this differential signal, and outputs the formed image. That is, the untouched panel 50 detects movement of a fingertip as a subject, based on images that are output from each solid-state image pickup device 10 owned by each camera 53.

More specifically, the camera 53 at a right upper position picks up images of a fingertip, and causes movement of the fingertip in an x direction and a z direction in FIG. 10 to be detected, and the camera 53 at a left upper position picks up images of the fingertip, and causes movement of the fingertip in a y direction and a z direction in FIG. 10 to be detected. By the above arrangement, the untouched panel 50 can detect three-dimensional movement of the fingertip. Therefore, the untouched panel 50 can be operated without directly touching the display 51 with a fingertip. In a case of drawing a picture following movement of a fingertip on the touched panel 50, for example, it can be arranged such that an image formed based on movement of the fingertip is displayed on the display 51. Further, in a case of moving a person appearing in a game displayed on the display 51 corresponding to movement of a fingertip on the untouched panel 50, for example, a formed image does not need to be displayed on the display 51.

According to the solid-state image pickup system 50, because movement of a subject is detected by the cameras 53 that use the solid-state image pickup devices 10, 30, 40 capable of easily detecting movement of the subject, the solid-state image pickup system 50 that can easily detect movement of the subject can be provided.

Further, according to the solid-state image pickup system 50 according to the present embodiment, because the untouched panel 50 can be operated without directly touching the display 51 with a fingertip, staining of a surface of the display 51 can be suppressed.

Further, according to the solid-state image pickup system 50 according to the present embodiment, because three-dimensional movement of a fingertip is detected by plural cameras 53, a transparent electrode for detecting a touch of the display 51 with a fingertip does not need to be provided in the display 51. Therefore, the solid-state image pickup system 50 increases brightness of the display 51, as compared with a conventional touch panel.

(A Modification)

The solid-state image pickup devices 10, 30, 40 according to the embodiments can easily realize the movement detection mode. However, a wide dynamic range mode can be realized directly based on, for example, a basic configuration of the solid-state image pickup system 10 according to the first embodiment. A method of realizing the wide dynamic range mode is explained next. In the following explanation of the method, only a portion that is different from the method of realizing the movement detection mode is explained.

FIG. 12 is a timing chart showing a relationship between operations of the address transistor ADDRESSTr, the reset transistor 18, the first reading gate 15a, and the second reading gate 15b, and the first and second detection signals that appear in the vertical signal line LS, in the wide dynamic range mode. FIG. 13 is a timing chart showing a relationship between operations of the first to third switches SW1, SW2, SW3, and the first and second detection signals that are input to the differential amplifier Diff-AMP, and a differential signal that is output from the differential amplifier Diff-AMP, in the wide dynamic range mode.

The operation of the wide dynamic range mode shown in FIG. 12 is performed by the control unit 27 (FIG. 3) that outputs a wide dynamic range mode signal to at least a part (the vertical register 25 and the common output circuit 17') of the output circuit explained in the first embodiment, as a mode switching signal as a control signal.

As shown in FIG. 12 and FIG. 13, in a case of the wide dynamic range mode, first, the reset transistor 18 is turned on at a timing of T1, and the detecting unit 16 is maintained at a constant level. Thereafter, the reset transistor 18 is turned off. The detecting unit 16 detects noise by induction, and a noise component is generated in the vertical signal line LS. Next, only the noise component is sampled at a timing of T2. That is, the first switch SW1 is turned on at the timing of T2, and is kept on during a constant time. Then, the noise component that appears in the vertical signal line LS is input to the minus terminal of the differential amplifier Diff-AMP, and is input to the capacitor C. Therefore, a potential based on the noise component is charged to the capacitor C. Accordingly, during a constant period, the capacitor C holds the potential based on the noise component. Consequently, even when the first switch SW1 is turned off, the potential that is charged to the capacitor C is continued to be applied to the minus terminal of the differential amplifier Diff-AMP, during a constant time.

Next, reading of the first signal charge that is accumulated in the first pixel 13a and reading of the second signal charge that is accumulated in the second pixel 13b are simultaneously performed at a timing of T3. Then, a detection signal that has a potential based on a charge amount corresponding to a sum of a charge amount of the first signal charge and a charge amount of the second signal charge appears in the vertical signal line LS. This detection signal is superimposed with the noise component.

Thereafter, the second and third switches SW2, SW3 are turned on at a timing of T31, and are kept on during a constant time, as shown in FIG. 13. Then, the detection signal is input to the plus terminal of the differential amplifier Diff-AMP, together with the noise component.

As described above, when a potential based on the detection signal and the noise component is being applied to the plus terminal of the differential amplifier Diff-AMP, a potential based on the noise component is being applied to the minus terminal.

A potential of the noise component applied to the plus terminal and a potential of the noise component applied to the minus terminal of the differential amplifier Diff-AMP, respectively, are equal. Therefore, when the third switch SW3 is turned on at the timing of T31, and is kept on during a constant time, only the detection signal obtained by cancelling the noise component is output from the differential amplifier Diff-AMP, as a differential signal.

Next, a reason that the wide dynamic range mode can be realized by simultaneously performing reading of the first signal charge and reading of the second signal charge and by adding both signal charges is explained with reference to FIG. 14.

Figure 14:
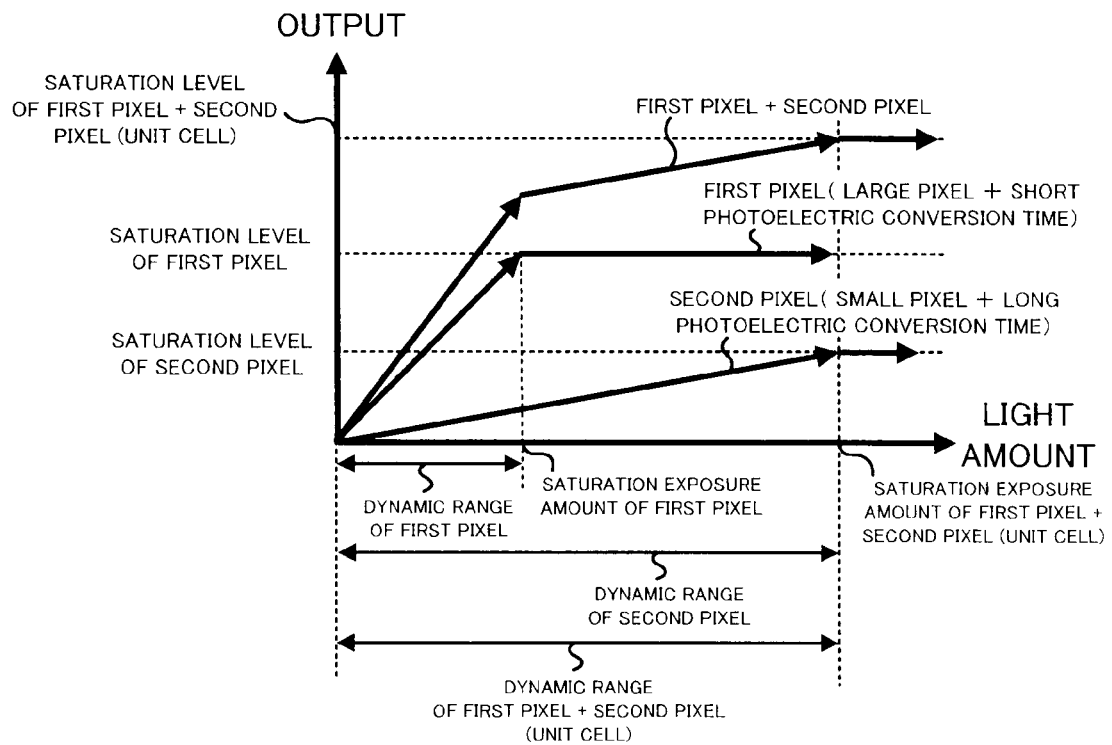
FIG. 14 is a diagram for explaining the wide dynamic range mode, and is a graph showing a relationship between an amount of light that a unit cell of the solid-state image pickup device according to the first embodiment receives, and a potential of a differential signal that is output from a differential amplifier.

FIG. 14 is a diagram for explaining the wide dynamic range mode, and is a graph showing a relationship between an amount of light that a unit cell 14 of the solid-state image pickup device 10 according to the first embodiment receives, and a potential of a differential signal that is output from the differential amplifier Diff-AMP.

As shown in FIG. 14, when images of a subject are picked up based on only the first pixel 13a, for example, because the first pixel 13a has a high sensitivity, even when light received from the subject has a low light amount, a charge amount of the first signal charge within the first photodiode 11a rapidly increases. Therefore, when images of the subject are picked up based on only the first pixel 13a, a high-sensitivity mode is realized.

However, because the charge amount of the first signal charge rapidly increases within the first photodiode 11a of the first pixel 13a, when the light received from the subject has a high light amount, the first photodiode 11a is saturated. Therefore, when images of the subject are picked up based on only the first pixel 13a, a dynamic range is narrow.

On the other hand, when images of the subject are picked up based on only the second pixel 13b, because the second pixel 13b has a low sensitivity, a charge amount of the second signal charge mildly increases, within the second photodiode 11b of the second pixel 13b. Therefore, even when the light received from the subject has a high light amount, the second photodiode 11b is not easily saturated. That is, when images of the subject are picked up based on only the second pixel 13b, a dynamic range is wide.

However, within the second photodiode 11b of the second pixel 13b, because a charge amount of the second signal charge mildly increases, when the light received from the subject has a low light amount, a charge amount of the second signal charge increases little within the second photodiode 11b. Therefore, when images of the subject are picked up by only the second pixel 13b, a sensitivity decreases.

On the other hand, when the first signal charge and the second signal charge are added together, even when light received from the subject has a low light amount, because the charge amount of the first signal charge rapidly increases within the first photodiode 11a, images of the subject can be picked up in a high sensitivity.

Further, even when the light received from the subject has a high light amount, because the charge amount of the second signal charge increases within the second photodiode 11b, a dynamic range which is the same as that when images of the subject are picked up based on only the second pixel 13b can be realized.

Therefore, the wide dynamic range mode can be realized by simultaneously performing reading of the first signal charge and reading of the second signal charge and by adding both signal charges.

In this way, any one of the solid-state image pickup devices 10, 30, 40 that can selectively realize the movement detection mode or the wide dynamic range mode can be arranged to be applied to the untouched panel 50 as the solid-state image pickup system 50, as in the fourth embodiment. It is effective to apply any one of the solid-state image pickup devices 10, 30, 40 that can selectively realize the movement detection mode or the wide dynamic range mode to the untouched panel 50 that has a camera function for picking up images of a stationary image, for example.

(A Modification of the Wide Dynamic Range Mode)

Figure 15:
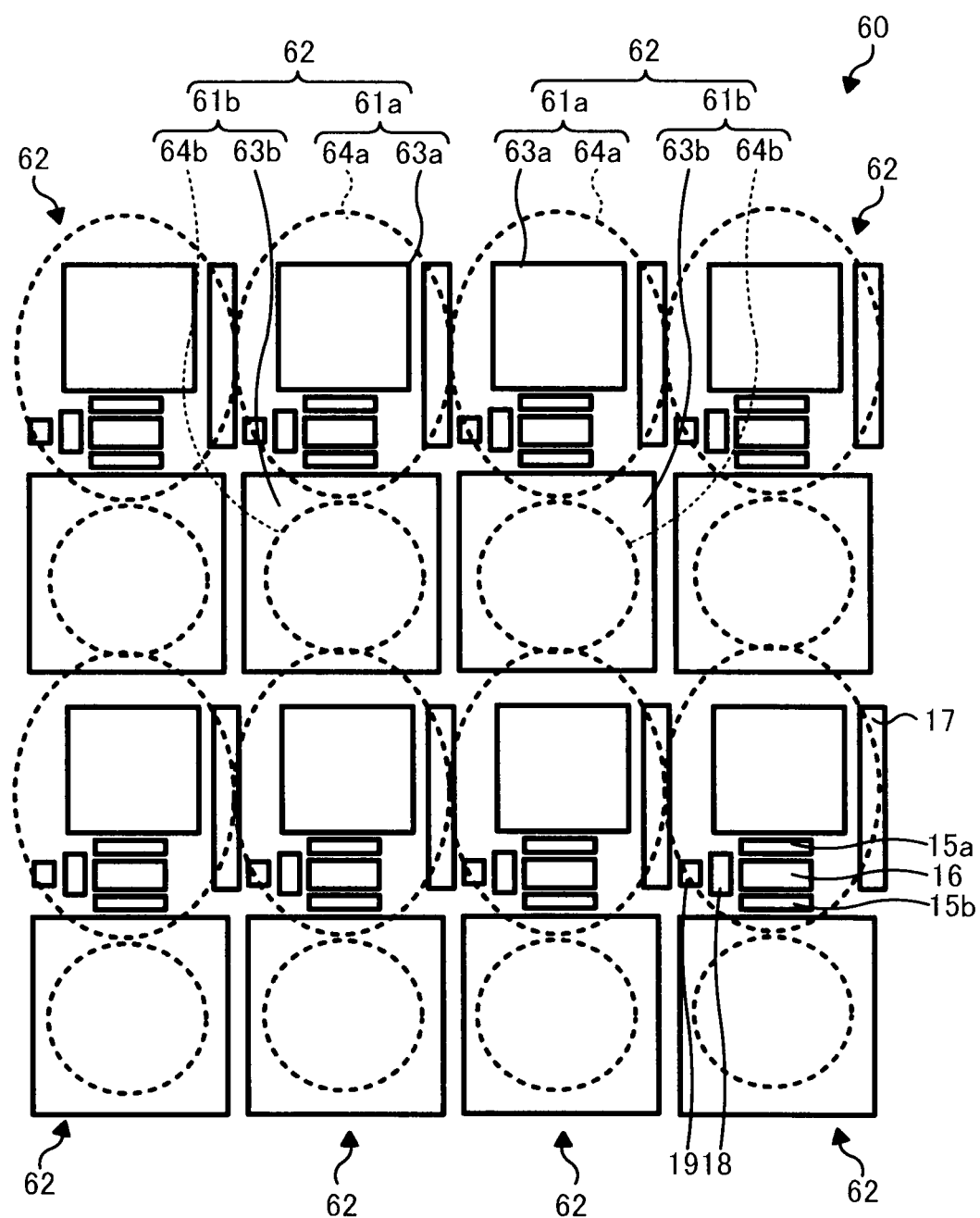
FIG. 15 is a plan view showing other modification of a solid-state image pickup device for realizing a wide dynamic range mode.

FIG. 15 is a plan view showing other modification of the solid-state image pickup device according to the first embodiment for realizing the wide dynamic range mode. A solid-state image pickup device 60 according to the modification shown in FIG. 15 is the same as the solid-state image pickup device according to the first embodiment in that the solid-state image pickup device 60 has a unit cell configured by a first pixel 61a of a high sensitivity having a large first microlens 64a, and a second pixel 61b of a low sensitivity having a second microlens 64b smaller than the first microlens 64a. However, the solid-state image pickup device 60 is different from the solid-state image pickup device 10 in that a first photodiode 63a of the first pixel 61a is smaller than a second photodiode 63b of the second pixel 61b.

The and first reading gates 15a, 15b, the detecting unit 16, the output circuit 17 of a unit cell, the reset transistor 18, and the drain 19 that are included in the unit cell 62 are configured in a similar manner to that of the solid-state image pickup device 10 according to the first embodiment.

The solid-state image pickup device 60 can also realize the movement detection mode, by operating in a similar manner to that of the image pickup method by the solid-state image pickup device 10 according to the first embodiment.

The solid-state image pickup device 60 can also realize the wide dynamic range mode, by operating in a similar manner to that of the image pickup method of the wide dynamic range mode by the solid-state image pickup device 10 according to the first embodiment. However, in a case of the solid-state image pickup device 60 according to the modification, it is possible to realize a wide dynamic range larger than that of the wide dynamic range mode by the solid-state image pickup device 10 (FIG. 1) according to the first embodiment. A reason for this is explained below.

Figure 16:
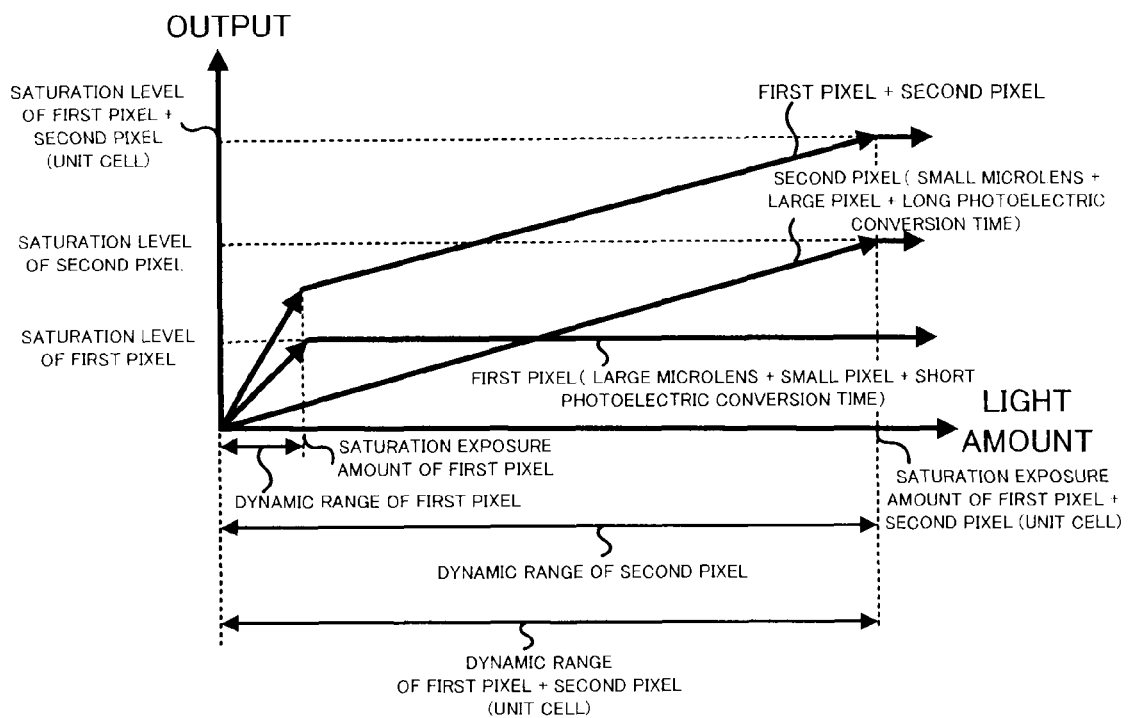
FIG. 16 is a diagram for explaining the wide dynamic range mode by the solid-state image pickup device shown in FIG. 15, and is a graph showing a relationship between an amount of light that a unit cell of the solid-state image pickup device receives, and a potential of a differential signal that is output from a differential amplifier.

FIG. 16 is a diagram showing a relationship between an amount of light that the unit cell 62 of the solid-state image pickup device 60 receives, and a potential of a differential signal that is output from the differential amplifier Diff-AMP.

When the first photodiode 63a of the first pixel 61a is formed small as shown in FIG. 15, a saturation level of the first pixel 61a decreases, as shown in FIG. 16, and therefore, a dynamic range of the first pixel 61a becomes small. However, when the second photodiode 63b of the second pixel 61b is formed large, a saturation level of the second pixel 61b increases, as shown in FIG. 16, and therefore, a dynamic range of the second pixel 61b becomes larger.

Because a dynamic range in a case of the wide dynamic range mode is the same as the dynamic range of the second pixel 61b, according to the solid-state image pickup device 60 according to the modification, a much wider dynamic range than that of the wide dynamic range mode according to the solid-state image pickup device 10 according to the first embodiment can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image pickup device comprising:
   a first pixel having a first photodiode which causes a first signal charge to be generated by receiving light and by photoelectrically converting the light;
   a second pixel having a second photodiode which causes a second signal charge to be generated by receiving light and by photoelectrically converting the light, and having a sensitivity of 1/n times of the first pixel; and
   an output circuit outputting a differential signal of a difference between a first detection signal and a second detection signal, the first detection signal being based on a charge amount of the first signal charge which is obtained by photoelectrically converting the light over a first photoelectric conversion period in the first pixel, and the second detection signal being based on a charge amount of the second signal charge which is obtained by photoelectrically converting the light over a second photoelectric conversion period having a length of n times of the first photoelectric conversion period in the second pixel, wherein the output circuit includes
   a detecting unit accumulating the first signal charge and the second signal charge,
   an amplifier transistor converting the first signal charge into the first detection signal, based on a charge amount of the first signal charge that is accumulated in the detecting unit, and converting the second signal charge into the second detection signal, based on a charge amount of the second signal charge that is accumulated in the detecting unit, and
   a differential amplifier having an inverting input terminal which is connected to the amplifier transistor and to which the first detection signal is input, a non-inverting input terminal which is connected to the amplifier transistor and to which the second detection signal is input, and an output terminal which outputs the differential signal as a difference between the first detection signal and the second detection signal.

2. The solid-state image pickup device according to claim 1, comprising a plurality of unit cells each including the first pixel and the second pixel, wherein
the unit cells are arrayed in a lattice shape.

3. The solid-state image pickup device according to claim 1, comprising a plurality of unit cells each including the first pixel and the second pixel, the first pixel including the first photodiode and a first microlens that is formed above the first photodiode, and the second pixel including the second photodiode and a second microlens that is formed above the second photodiode and that is smaller than the first microlens, wherein
the unit cells are arrayed such that a plurality of first microlenses and a plurality of second microlenses are arrayed in a check shape, respectively.

4. The solid-state image pickup device according to claim 3, comprising a plurality of unit cells each including
the first pixel having a color filter that causes any one of a red color, a blue color, and a green color to be transmitted between the first photodiode and the first microlens, and
the second pixel having a color filter that causes a color which is the same as that of a color filter held by the first pixel to be transmitted between the second photodiode and the second microlens, wherein
the unit cells are arrayed such that the color filters are in a Bayer array.

5. A solid-state image pickup system that has a solid-state image pickup device comprising:
a first pixel having a first photodiode which causes a first signal charge to be generated by receiving light and by photoelectrically converting the light, and a first microlens that is formed above the first photodiode;
a second pixel having a second photodiode which causes a second signal charge to be generated by receiving light and by photoelectrically converting the light, and a second microlens which is formed above the second photodiode and is smaller than the first microlens, and further having a sensitivity of 1/n times of the first pixel and a photoelectric conversion period of n times of the first pixel;
an output circuit outputting a differential signal of a difference between a first detection signal based on a charge amount of the first signal charge and a second detection signal based on a charge amount of the second signal charge; and
an image forming unit forming an image based on the differential signal that is output from the output circuit, wherein
the solid-state image pickup system causes the output circuit to output zero as the differential signal, based on the first detection signal and the second detection signal becoming equal to each other, if the light is reflection light that is reflected by a stationary subject, and
detects movement of a subject, based on the first detection signal and the second detection signal becoming different from each other, by causing the output circuit to output a differential value between both detection signals as the differential signal, and by causing the image forming unit to form an image based on the differential value, if the light is reflection light that is reflected by the subject that moves.

6. The solid-state image pickup system according to claim 5, having a plurality of the solid-state image pickup devices.

7. The solid-state image pickup system according to claim 5, further comprising a display unit displaying the image formed by the image forming unit.

8. A solid-state image pickup device comprising:
a first pixel having a first photodiode which causes a first signal charge to be generated by receiving light and by photoelectrically converting the light, and a first microlens that is formed above the first photodiode;
a second pixel having a second photodiode which causes a second signal charge to be generated by receiving light and by photoelectrically converting the light, and a second microlens which is formed above the second photodiode and is smaller than the first microlens, and further having a sensitivity of 1/n times of the first pixel;
an output circuit outputting a signal based on a charge amount of the first signal charge and a charge amount of the second signal charge; and
a control unit controlling an operation of the output circuit, by supplying a mode switching signal to the output circuit, wherein
the output circuit outputs the signal, based on a sum of or a difference between a charge amount of the first signal charge and a charge amount of the second signal charge, based on the mode switching signal.

9. The solid-state image pickup device according to claim 8, wherein
the output circuit includes
a first reading gate reading the first signal charge which is generated in the first photodiode,
a second reading gate reading the second signal charge which is generated in the second photodiode,
a detecting unit accumulating the first signal charge which is read by the first reading gate, and the second signal charge which is read by the second reading gate,
an amplifier transistor converting the first signal charge into the first detection signal, based on a charge amount of the first signal charge accumulated in the detecting unit, and converting the second signal charge into the second detection signal voltage, based on a charge amount of the second signal charge accumulated in the detecting unit, and
a differential amplifier having an inverting input terminal that is connected to the amplifier transistor via a first switch, a non-inverting input terminal that is connected to a second switch via the amplifier transistor, and an output terminal, wherein
the mode switching signal is used to control operations of the first reading gate, the second reading gate, the first switch, and the second switch.

10. The solid-state image pickup device according to claim 9, wherein
the mode switching signal is a movement detection mode signal or a wide dynamic range mode signal, and
if the mode switching signal is the movement detection mode signal,
the mode switching signal is used to control the first reading gate and the second reading gate such that a photoelectrical conversion period of the second pixel becomes n times of a photoelectric conversion period of the first pixel, and
is also used to control the first switch and the second switch such that the first detection signal is input to the inverting input terminal of the differential amplifier, and the second detection signal is input to the non-inverting input terminal of the differential amplifier, and the output terminal of the differential amplifier outputs the signal corresponding to a difference between the first detection signal and the second detection signal.

11. The solid-state image pickup device according to claim 9, wherein the mode switching signal is a movement detection mode signal or a wide dynamic range mode signal, and if the mode switching signal is the wide dynamic range mode signal, the mode switching signal is used to control the first reading gate and the second reading gate such that a photoelectric conversion period of the second pixel becomes longer than a photoelectric conversion period of the first pixel, and is also used to control the first switch and the second switch such that a sum of the first detection signal and the second detection signal is input to the non-inverting input terminal of the differential amplifier, wherein the output terminal of the differential amplifier outputs the signal corresponding to a sum of the first detection signal and the second detection signal.

12. The solid-state image pickup device according to claim 8, having a plurality of unit cells each including the first pixel and the second pixel, wherein the unit cells are arrayed in a lattice shape.

13. The solid-state image pickup device according to claim 8, having a plurality of unit cells each including the first pixel and the second pixel, wherein the unit cells are arrayed such that a plurality of first microlenses and a plurality of second microlenses are arrayed in a check shape, respectively.

14. The solid-state image pickup device according to claim 8, comprising a plurality of unit cells each including the first pixel having a color filter that causes any one of a red color, a blue color, and a green color to be transmitted between the first photodiode and the first microlens, and the second pixel having a color filter that causes a color which is the same as that of a color filter held by the first pixel to be transmitted between the second photodiode and the second microlens, wherein the unit cells are arrayed such that the color filters are in a Bayer array.

15. A solid-state image pickup system that has a solid-state image pickup device comprising:

a first pixel having a first photodiode which causes a first signal charge to be generated by receiving light and by photoelectrically converting the light, and a first microlens that is formed above the first photodiode;

a second pixel having a second photodiode which causes a second signal charge to be generated by receiving light and by photoelectrically converting the light, and a second microlens which is formed above the second photodiode and is smaller than the first microlens, and further having a sensitivity of 1/n times of the first pixel;

an output circuit outputting a signal based on a charge amount of the first signal charge and a charge amount of the second signal charge;

a control unit that controlling an operation of the output circuit, by supplying a mode switching signal to the output circuit; and an image forming unit forming an image based on the signal that is output from the output circuit, wherein the solid-sate image pickup system cause the output circuit to output zero as the signal, based on the first detection signal based on a charge amount of the first signal charge and the second detection signal based on a charge amount of the second signal charge becoming equal to each other, if the output circuit receives a movement detection mode signal from the control unit as the mode switching signal and if the light is reflection light that is reflected by a stationary subject, the solid-sate image pickup system cause the output circuit to output a differential value between the first detection signal and the second detection signal as the signal, and detects movement of a subject by the image forming unit forming an image based on the differential value, based on the first detection signal and the second detection signal becoming different, if the output circuit receives the movement detection mode signal from the control unit as the mode switching signal and if the light is reflection light that is reflected by the subject that moves, the solid-sate image pickup system cause the output circuit to output the signal, based on a sum of a charge amount of the first signal charge and a charge amount of the second signal charge, and cause the image forming unit to form and output the image based on the signal based on the sum, if the output circuit receives a wide dynamic range mode signal from the control unit as the mode switching signal.

16. The solid-state image pickup system according to claim 15, having a plurality of the solid-state image pickup devices.

17. The solid-state image pickup system according to claim 15, further comprising a display unit displaying the image formed by the image forming unit.

18. The solid-state image pickup device according to claim 1, comprising a drain in which a charge accumulated in the first pixel is discharged, wherein, in the second photoelectric conversion period, the first pixel generates the first signal charge over the first photoelectric conversion period after the first pixel discharges the accumulated charge to the drain.

19. A solid-state image pickup device comprising:

a first pixel having a first photodiode which causes a first signal charge to be generated by receiving light and by photoelectrically converting the light, the first pixel having a first sensitivity which is determined in accordance with a signal charge amount of the first signal charge generated per unit time;

a second pixel having a second photodiode which causes a second signal charge to be generated by receiving light and by photoelectrically converting the light, and having a sensitivity of 1/n times of the first pixel; and an output circuit outputting a differential signal of a difference between a first detection signal and a second detection signal, the first detection signal being based on a charge amount of the first signal charge which is obtained by photoelectrically converting the light over a first photoelectric conversion period in the first pixel, and the second detection signal being based on a charge amount of the second signal charge which is obtained by photoelectrically converting the light over a second photoelectric conversion period having a length of n times of the first photoelectric conversion period in the second pixel, wherein the output circuit outputs zero as the differential signal, based on the first detection signal and the second detection signal becoming equal to each other, if the light is reflection light that is reflected by a stationary subject.

\* \* \* \* \*

UNITED STATES PATENT AND TRADEMARK OFFICE
CERTIFICATE OF CORRECTION

| | | |
|---|---|---|
| PATENT NO. | : 8,890,991 B2 | |
| APPLICATION NO. | : 13/421195 | |
| DATED | : November 18, 2014 | |
| INVENTOR(S) | : Hirokazu Sekine | |

It is certified that error appears in the above-identified patent and that said Letters Patent is hereby corrected as shown below:

On the title page, Item (54) and in the Specification, Column 1, the Title is incorrect. Item (54) and Column 1 should read:

--SOLID-STATE IMAGE PICKUP DEVICE AND SYSTEM HAVING PHOTODIODES OF VARYING SIZES AND SENSITIVITIES IN EACH UNIT CELL TO DETECT MOVEMENT OF A SUBJECT--

Signed and Sealed this
Third Day of March, 2015

Michelle K. Lee
*Deputy Director of the United States Patent and Trademark Office*